US012671054B2

(12) United States Patent
Puchberger et al.

(10) Patent No.: US 12,671,054 B2
(45) Date of Patent: Jun. 30, 2026

(54) ADJUSTABLE PERMANENT MAGNETIC LENS HAVING SHUNTING DEVICE

(71) Applicant: IMS Nanofabrication GmbH, Brunn am Gebirge (AT)

(72) Inventors: Dietmar Puchberger, Vienna (AT); Johannes Leitner, Vienna (AT); Patrick Mayrhofer, Vienna (AT); Christoph Spengler, Vienna (AT); Elmar Platzgummer, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 388 days.

(21) Appl. No.: 18/313,995

(22) Filed: May 8, 2023

(65) Prior Publication Data

US 2023/0360878 A1     Nov. 9, 2023

(30) Foreign Application Priority Data

May 9, 2022     (EP) .................................... 22172309

(51) Int. Cl.
*H01J 37/143*          (2006.01)
*G03F 7/00*            (2006.01)
          (Continued)

(52) U.S. Cl.
CPC .......... *H01J 37/143* (2013.01); *G03F 7/7015* (2013.01); *G03F 7/704* (2013.01);
          (Continued)

(58) Field of Classification Search
CPC .... H01J 37/143; H01J 37/141; H01J 37/3177; H01J 37/09; H01J 37/1477; H01J 37/21;
          (Continued)

(56) References Cited

U.S. PATENT DOCUMENTS 2,369,796  A     2/1945  Ramberg
2,503,173  A     4/1950  Reisner
          (Continued)

FOREIGN PATENT DOCUMENTS

DE          869995 C       3/1953
DE          892036 C      10/1953
          (Continued)

OTHER PUBLICATIONS

Extended European Search Report for European Application No. 22172309.1, Search completed Jan. 18, 2023, Mailed Dec. 19, 2022, 22 Pgs.
          (Continued)

*Primary Examiner* — Robert H Kim
*Assistant Examiner* — Christopher J Gassen
(74) *Attorney, Agent, or Firm* — KPPB LLP

(57)          ABSTRACT

A fine-adjustable charged particle lens comprises a magnetic circuit assembly including permanent magnets, a yoke body, and a shunting device comprising a shunting component, and this assembly surrounds a beam passage extending along the longitudinal axis (cx). The shunting device is placed in the yoke body besides the permanent magnets and may be composed of several sector components, comprising different high magnetically permeable materials. The permanent magnet and the yoke body form a magnetic circuit having at least two gaps, in order to generate a magnetic field reaching inwards into the beam passage, into which a sleeve insert having electrostatic electrodes can be inserted, which may also generate an electric field spatially overlapping said magnetic field. The shunting device partially bypasses the magnetic flux of said circuit assembly and thus reduces the magnetic field to a desired value.

17 Claims, 10 Drawing Sheets

(51) Int. Cl.

| | |
|---|---|
| *H01J 37/09* | (2006.01) |
| *H01J 37/141* | (2006.01) |
| *H01J 37/147* | (2006.01) |
| *H01J 37/21* | (2006.01) |
| *H01J 37/317* | (2006.01) |

(52) U.S. Cl.
CPC ........ *H01J 37/141* (2013.01); *H01J 37/3177* (2013.01); *H01J 37/09* (2013.01); *H01J 37/1477* (2013.01); *H01J 37/21* (2013.01); *H01J 2237/0264* (2013.01); *H01J 2237/0455* (2013.01); *H01J 2237/103* (2013.01); *H01J 2237/1415* (2013.01); *H01J 2237/1516* (2013.01); *H01J 2237/24564* (2013.01); *H01J 2237/30433* (2013.01)

(58) Field of Classification Search
CPC ....... H01J 2237/0264; H01J 2237/0455; H01J 2237/103; H01J 2237/1415; H01J 2237/1516; H01J 2237/24564; H01J 2237/30433; H01J 37/3174; H01J 37/145; H01J 37/045; G03F 7/7015; G03F 7/704
See application file for complete search history.

(56) References Cited

U.S. PATENT DOCUMENTS

| | | | |
|---|---|---|---|
| 2,714,678 A | | 8/1955 | Otto |
| 3,100,260 A | * | 8/1963 | Wilska .................. H01J 37/141 |
| | | | 850/9 |
| 4,912,405 A | | 3/1990 | Richardson |
| 6,443,699 B1 | | 9/2002 | Mashey |
| 6,768,125 B2 | | 7/2004 | Platzgummer et al. |
| 6,858,118 B2 | | 2/2005 | Platzgummer et al. |
| 7,067,820 B2 | | 6/2006 | Buijsse |
| 7,199,373 B2 | | 4/2007 | Stengl et al. |
| 7,214,951 B2 | | 5/2007 | Stengl et al. |
| 7,276,714 B2 | | 10/2007 | Platzgummer et al. |
| 7,772,574 B2 | | 8/2010 | Stengl et al. |
| 7,777,201 B2 | | 8/2010 | Fragner et al. |
| 7,781,748 B2 | | 8/2010 | Platzgummer |
| 8,183,543 B2 | | 5/2012 | Platzgummer |
| 8,222,621 B2 | | 7/2012 | Fragner et al. |
| 8,304,749 B2 | | 11/2012 | Platzgummer et al. |
| 8,378,320 B2 | | 2/2013 | Platzgummer |
| 8,546,767 B2 | | 10/2013 | Platzgummer et al. |
| 9,053,906 B2 | | 6/2015 | Platzgummer |
| 9,165,745 B2 | | 10/2015 | Luo |
| 9,269,543 B2 | | 2/2016 | Reiter et al. |
| 9,443,699 B2 | | 9/2016 | Platzgummer et al. |
| 9,495,499 B2 | | 11/2016 | Platzgummer et al. |
| 9,520,268 B2 | | 12/2016 | Platzgummer |
| 9,568,907 B2 | | 2/2017 | Platzgummer et al. |
| 9,653,263 B2 | | 5/2017 | Platzgummer et al. |
| 9,922,796 B1 | * | 3/2018 | Frosien ................. H01J 37/153 |
| 10,325,757 B2 | | 6/2019 | Platzgummer et al. |

| | | | | |
|---|---|---|---|---|
| 10,483,080 B1 | | 11/2019 | Cook et al. | |
| 12,500,060 B2 | | 12/2025 | Spengler et al. | |
| 2002/0096644 A1 | * | 7/2002 | Simizu ................ H01J 37/3007 |
| | | | | 250/492.1 |
| 2004/0135102 A1 | | 7/2004 | Muraki et al. | |
| 2005/0242303 A1 | | 11/2005 | Platzgummer | |
| 2009/0057571 A1 | | 3/2009 | Goto | |
| 2009/0159810 A1 | * | 6/2009 | Knippelmeyer ........ H01J 37/24 |
| | | | | 250/396 ML |
| 2009/0173887 A1 | * | 7/2009 | Ito ......................... H01J 37/153 |
| | | | | 250/396 ML |
| 2011/0049393 A1 | | 3/2011 | De Boer et al. | |
| 2012/0091318 A1 | | 4/2012 | Wieland et al. | |
| 2012/0286173 A1 | | 11/2012 | Van De Peut et al. | |
| 2014/0264085 A1 | | 9/2014 | Van De Peut et al. | |
| 2015/0021476 A1 | * | 1/2015 | Shanel ................... G21K 1/093 |
| | | | | 250/396 ML |
| 2015/0311031 A1 | | 10/2015 | Platzgummer et al. | |
| 2015/0357157 A1 | | 12/2015 | Mueller | |
| 2016/0064180 A1 | | 3/2016 | Ren et al. | |
| 2018/0114672 A1 | * | 4/2018 | Ogawa ................... H01J 37/023 |
| 2019/0304737 A1 | * | 10/2019 | Ogasawara ........... H01J 37/141 |
| 2020/0161079 A1 | | 5/2020 | Ren et al. | |
| 2020/0312619 A1 | | 10/2020 | Mangnus et al. | |
| 2022/0277921 A1 | * | 9/2022 | Cook ...................... H01J 37/28 |
| 2022/0384143 A1 | | 12/2022 | Platzgummer et al. | |
| 2023/0015805 A1 | * | 1/2023 | Spengler .............. H01J 37/141 |
| 2023/0052445 A1 | | 2/2023 | Platzgummer et al. | |
| 2023/0360880 A1 | | 11/2023 | Eder-Kapl et al. | |

FOREIGN PATENT DOCUMENTS

| | | |
|---|---|---|
| DE | 893107 C | 10/1953 |
| DE | 1035813 B | 8/1958 |
| EP | 2187427 A2 | 5/2010 |
| EP | 2363875 A1 | 9/2011 |
| GB | 689527 A | 4/1953 |
| JP | 2007311117 A | 11/2007 |
| WO | 2012041464 A1 | 4/2012 |

OTHER PUBLICATIONS

Extended European Search Report for European Application No. 21175588.9, Search Completed Nov. 8, 2021, Mailed Nov. 16, 2021, 12 Pgs.

Extended European Search Report for European Application No. 22171589.9, Search completed Oct. 24, 2022, Mailed Nov. 7, 2022, 5 Pgs.

Extended European Search Report for European Application No. 22189892.7, Search completed Feb. 20, 2023, Mailed Mar. 21, 2023, 10 Pgs.

Extended European Search Report for European Application No. 21185599.4, Search Completed Jan. 4, 2022, Mailed Jan. 17, 2022, 6 pgs.

Muller, Controllable magnetostatic lens systems for electron microscope, Journal for Scientific Microscopy and Microscopic Technique, vol. 63, No. 5, Jun. 1957, pp. 303-328.

* cited by examiner

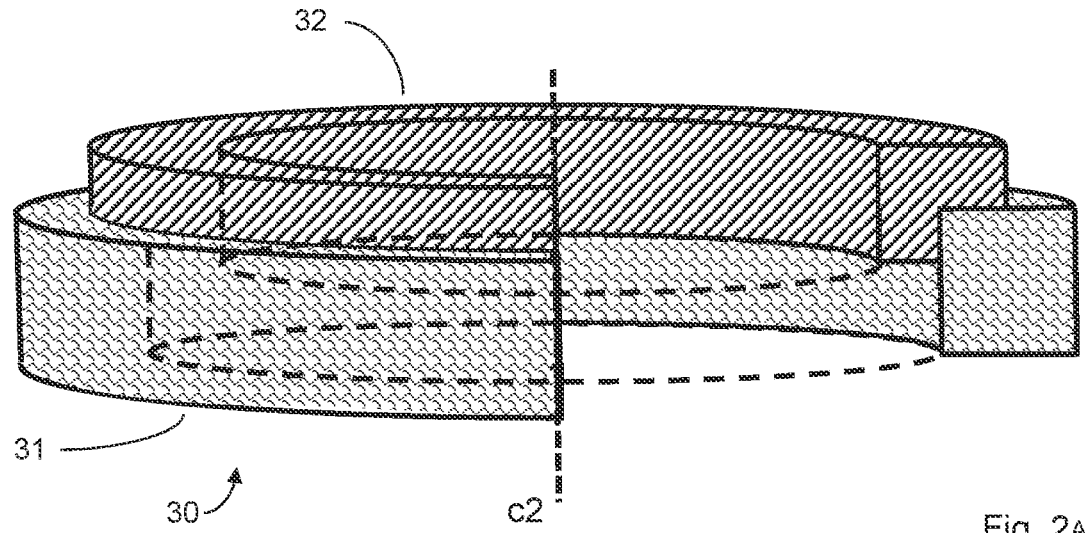
Fig. 2A
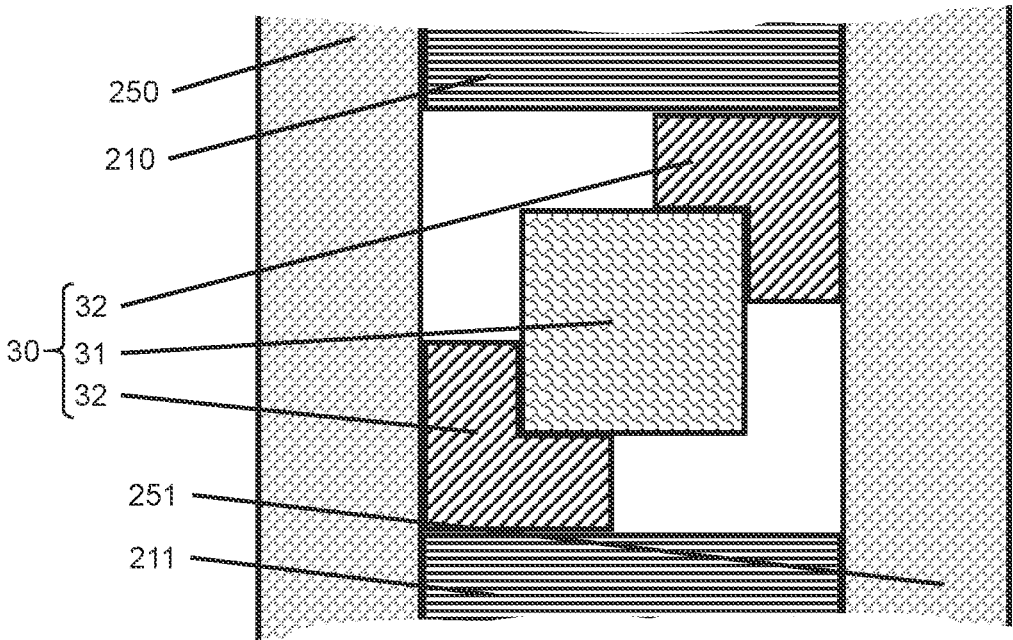
Fig. 2B
Fig. 2

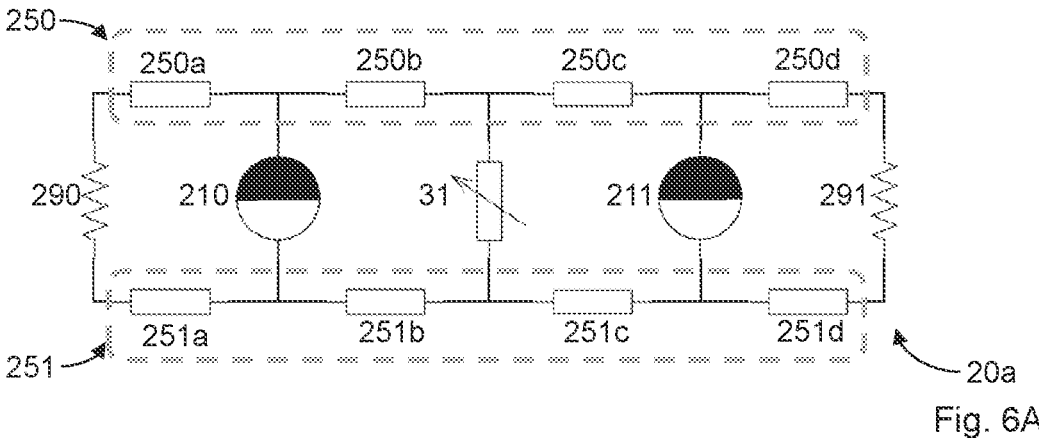
Fig. 6A
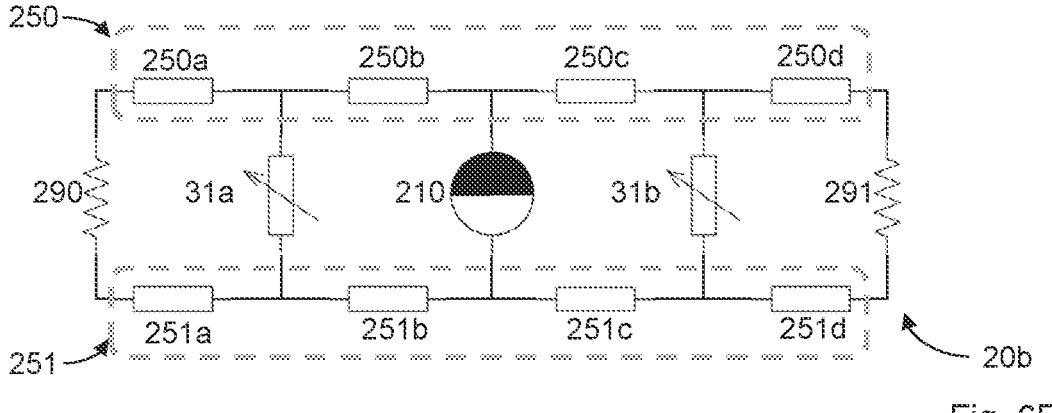
Fig. 6B
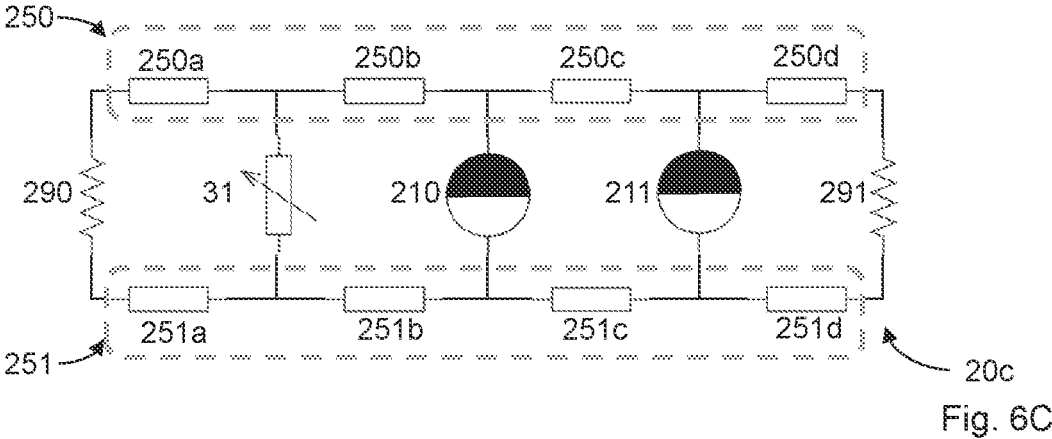
Fig. 6C
Fig. 6

ADJUSTABLE PERMANENT MAGNETIC LENS HAVING SHUNTING DEVICE

CROSS-REFERENCE TO RELATED APPLICATION

The current application claims priority to European Patent Application No. 22172309 filed on May 9, 2022, the disclosure of which is incorporated herein by reference in its entirety for all purposes.

FIELD OF THE INVENTION

The present invention relates to a charged particle lens comprising a permanent magnet configured to modify a charged particle beam of a charged particle optical apparatus, which is designed to be used for lithography writing and like processing purposes, including nano-patterning. Such a lens is provided with a passage for a charged particle beam along a longitudinal direction, which corresponds to the direction of propagation of the charged particle beam itself, and will usually be aligned concentrically with the optical axis of the charged particle optical apparatus it is used in.

The invention also relates to an electromagnetic lens including a charged particle magnetic lens, as well as a charged particle optical apparatus including a lens of the mentioned type.

The applicant has realized charged particle multi-beam apparatuses, which can incorporate one or more lenses of the mentioned type, and has developed the corresponding charged particle optical components, pattern definition devices, and writing methods, suitable for multiple charged particle beams at once; they have commercialized thereof a 50 keV electron multi-beam writer called eMET (electron Mask Exposure Tool) or MBMW (multi-beam mask writer), which is used to realize arbitrary photomasks for 193 nm immersion lithography, as well as masks for EUV lithography and templates for nanoimprint lithography. The applicants system has also been called PML2 (Projection Mask-Less Lithography), used for electron beam direct writer (EBDW) applications directly on substrates.

BACKGROUND

For increasing throughput in high-volume industrial manufacturing, with particular regard for mask-less lithography and direct-writing on substrates (e.g. wafers), there is the need to increase the electrical current carried by the charged particle beam passing through the charged particle nano-pattering apparatus; this is usually at the cost of limiting the resolution due to Coulombic interactions between the charged particles and will require a corresponding compensation by reduction of the magnitude of the optical aberrations introduced by the apparatus through other mechanisms.

A typical multi-column system includes multiple optical sub-columns, each of which comprises an illuminating system that delivers a broad telecentric charged particle beam to a pattern definition system followed by a charged particle projection optics, which for example includes a multitude of electrostatic, magnetic, and/or electromagnetic lenses.

For using such a system as a high-throughput wafer-direct-writer it will be necessary to place a substantial number of columns above one semiconductor wafer, e.g. in the order of one hundred columns. However, this setup limits the radial dimension of each column to a diameter of just a fraction of the width of the full wafer; for instance in the case of a typical 300 mm (12") wafer, a diameter of roughly 30 mm may be used. Slim-diameter magnetic lenses, on the other hand, cannot be realized by coil-based magnetic lenses, because reduction of the column diameter would correspond to extremely large Joule heating due to the large electrical currents needed to operate the coils to generate sufficiently strong magnetic fields; however, there is insufficient space for an adequate temperature-control system, including high-precision sensors and isotropic and homogeneous cooling, which would be required for conventional coil-based magnetic lenses.

SUMMARY OF THE INVENTION

In view of the above, it is an object of the present invention to provide a charged particle lens which includes permanent magnets, but allows for adjusting the optical properties of the lens with high precision. At the same time, it is desired to increase the range of permanent magnets that can be employed in this lens setup. Furthermore, lenses of this invention are of slim shape and enable confinement of the magnetic and electric fields within a close vicinity of the lens itself; thus enabling multicolumn optics of reduced cross-talk.

The above object is met by a lens configured to modify (e.g. shape, focus/defocus or otherwise manipulate) a charged particle beam of a charged particle optical apparatus, the lens being provided with a beam passage, extending primarily along a longitudinal axis and allowing the passage of said charged particle beam, further the lens includes a magnetic circuit assembly, which comprises at least one permanent magnet, a yoke body composed of at least two components of high magnetic permeability, and at least one shunting device.

The yoke body includes a first yoke component which can be realizing an inner yoke shell, arranged surrounding the beam passage, and a second yoke component which can be realizing an outer yoke shell, arranged surrounding the inner yoke shell (herein the terms "inner" and "outer" refer with respect to their relative position within the lens assembly and central axis); these yoke components are arranged circumferential around the longitudinal axis and are suitably made of magnetic highly permeable materials such as ferromagnetic or ferrimagnetic materials.

The at least one permanent magnet is arranged between the at least two yoke components, i.e. around the inner yoke shell and within the outer yoke shell, and comprises a permanent magnetic material that is magnetically mainly oriented with its two magnetic poles towards respective yoke components.

The permanent magnet and the yoke body form a closed magnetic circuit, but having at least two gaps formed between respective faces of different yoke components opening at the beam passage (for instance located at each axial ends, between faces of the inner yoke shell towards a respectively corresponding face of the outer yoke shell); thus, the magnetic circuit directs a magnetic flux effected by the permanent magnets through the yoke body and induces a magnetic field in the gaps, which also reaches into the beam passage. It is this magnetic field from the gaps that is used to form a magnetic lens for the charged particle beam propagating in the beam passage along the longitudinal axis. Manufacturing of said magnetic lenses can typically reach magnetic field accuracies within a range of 1%-5% around the targeted value.

The shunting device(s), comprising a magnetic highly permeable material, will be arranged at a defined position between components of the yoke body, for instance at a suitable location between two mentioned yoke components, where it is able to bypass a defined portion of the magnetic flux away from the gaps. This allows to reduce the magnetic field reaching the gaps and forming the magnetic lens effect inside the charged particle beam passage. Accuracies of such shunted lenses can be within a range of 0.1%-0.5% to a desired value of magnetic fields, which therefore yields magnetic lens manufacturing with roughly an order of magnitude more efficiency, i.e. closer to designed optical properties, e.g. focal length; compared to the performance of the same magnetic lenses without shunting devices. While deviations towards larger magnetizations than anticipated can be compensated by reducing the flux in the gaps to a certain amount, said shunting device cannot increase the flux, and is therefore limiting the manufacturing yield on one lower magnetization end.

In the technical solution underlying the invention, the yoke components and the at least one permanent magnet together form a closed magnetic circuit with at least two gaps, but optionally also more than two gaps, which are located next to the beam passage; since these gaps serve to induce a defined magnetic flux density and thus magnetic field reaching into the beam passage, acting as a magnetic lens. The at least one shunting device shall (with regard to the magnetic circuit, see FIG. 6) be placed in parallel to magnets and gaps and in series with at least the magnetic reluctance formed of portions of the yoke components. It is held in a position designed to reduce the deviation of magnetic fields from the designed values of each lens. The shunting device will comprise a shunting component, made of magnetically permeable material, and is associated with a holder, which will be supporting and stabilizing the shunting component on a defined position within the lens assembly. It will be mounted in a space between yoke components, preferably next to at least one permanent magnet of the lens which is to be shunted.

Furthermore, in suitable embodiments, the at least one shunting component may advantageously be composed of two or more sector components made of magnetically permeable materials, said sector components being arranged around the longitudinal axis at respectively different azimuthal positions. The sector components may be realized with different magnetically permeable materials; in particular, at least one of said sector components may comprise a magnetically permeable material having a magnetic permeability that is different from the magnetic permeability of the magnetically permeable materials of the other sector components. This variant will enable the magnetic lens to have magnetic flux densities that differentially vary along the azimuthal coordinate (i.e., at different angles) and thus azimuthally varying magnetic fields around the longitudinal axis. In particular, this configuration can be used to generate azimuthal varying magnetic fields around the longitudinal axis in at least one of said gaps, configured to act like a magnetic multipole.

The shunting component and/or its sector components may be of specific shapes and sizes, which allows them to be located between the yoke components, as well as to reduce the flux in the magnetic circuit to the calculated amount; in other words: it is configured to tune the magnetic circuit assembly, by forming a bypass for some of the magnetic flux within the magnetic circuit, and thus reducing some of the magnetic fields of the lens. The position of the shunting element allows local tuning of the flux density; in fact, asymmetric positions or material properties could be used to counteract and tune asymmetries of the magnet circuit assembly, e.g. by shifting the device along the longitudinal axis. And therefore, deviations in strength and partially also direction from desired nominal values can be lowered; so as to reach its specified properties according to initial design, which otherwise might not be met with the manufacturing process of the permanent magnet and its immanent tolerances.

The invention allows the use of permanent magnets as presently manufactured, which can be assembled into a charged particle lens, by adjusting the magnetic flux using the mentioned shunting device. Thus, the magnetic field defining the lens effect at the locations of the gaps can be fine-tuned. Therefore, the invention allows to account for limited accuracies of manufacturing of permanent magnet materials and components and distinctly helps to limit effects thereof. It also incorporates reduction of stray magnetic fields.

Additionally, with regard to the invention several optional developments are envisaged, which can be combined wherever suitable, as follows:

For instance, one yoke component may realize a housing body of the lens which surrounds the other parts of the magnetic circuit, and in particular other yoke components, also the permanent magnet(s) and shunting device(s). Generally, some parts of the magnetic circuit may be used for realizing a housing of the lens, and the at least one permanent magnet and/or the at least one shunting device, all arranged around the inner yoke shell, and/or all yoke components could also be part of the housing body of the lens.

In the context of sectorized components, also the at least one permanent magnet may be composed of at least two sub-components arranged around the longitudinal axis at respectively different azimuthal positions. This will not only enhance the azimuthal effect of the sector shunting components but also incur a cooperative effect between sector shunting components and sector magnets. In order to further enhance and modulate this interaction, it may be of further advantage to have one or more shunting devices placed between respective two of said permanentmagnet sub-components; in particular, a shunting device and/or a sector component thereof may be located at an azimuthal position between the (azimuthal) position of the respective permanent-magnet sub-components.

For supporting the one or more shunting devices at its/their respective defined positions, suitable holders are provided within the yoke body. Furthermore, the shunting element(s) and/or the shunting component(s) thereof may be composite, for instance composed of one or more sectors arranged around the longitudinal axis and/or segmented into two or more layers stacked along the longitudinal axis. Said sub-components (sectors, segments and/or layers) can also be made of varying magnetically permeable materials to form local gradients of the flux reduction.

In many typical embodiments the permanent magnet(s) may have magnetization oriented substantially radially; in a corresponding manner the shunting device(s) may comprise a material of high magnetic permeability having an axis of preferred magnetization oriented substantially radially. Herein, the expression "substantially radial" is used to include the case that the orientation is "operationally radial" such that the magnetic flux through the permanent magnet or shunting element to yoke components flows along a generally radial direction (flowing from a relative inner yoke component to a relative outer yoke component or vice versa)

In an advantageous development the permanent magnet(s) and/or the shunting component(s) may also be composed of two or more layers stacked along the longitudinal axis;

furthermore, it may be suitable to realize the permanent magnet(s) composed of three or more sectors arranged around the longitudinal axis along a circumferential direction, where preferably the magnet sectors are substantially wedge-shaped elements forming sectors with respect to the longitudinal axis. And in both cases, between respective two sub-components, i.e. layers or sectors, one or more shunting devices may be placed.

In many embodiments the at least one shunting device may be a ring of circular shape or other shape, such as elliptical, oval or more general shape (i.e., general hollow cylinder or polygonal hollow prism); the ring shape may also be composed of two or more (e.g. four, six, eight) sub-components, sectors arranged around the longitudinal axis along a circumferential direction and forming said shape, and/or composed of segments along the longitudinal direction. Also specifically shaped shunting devices filling only sectors of some spaces within the yoke components, which thus locally divert the magnetic flux, may be used to adjust asymmetries; said elements may also be composed of different materials enabling a varying magnetic permeability of the composed shunting element. Said asymmetry with respect to the rotational symmetry of the shunting element may also be used to construct magnetic multipole like assemblies in the lens, when the variation of magnetic fields with the shunting element is varying around the longitudinal axis. Alternatively to this or in combination with this, the shunting element (or some or all of the subcomponents) may be composed of two or more layers (segments) stacked along the longitudinal axis.

A further aspect of the invention relates to an electromagnetic lens which includes the charged particle lens according to the invention and a sleeve insert inserted into the beam passage along the longitudinal axis, with the sleeve insert surrounding a smaller portion of the beam passage opening, but extending between both ends thereof along the longitudinal axis; preferably at least overlapping the gaps of the yoke components. This sleeve insert comprises one or more electrically conductive electrode elements, to which a respective electric potential can be applied using power supplies so as to generate an electric field within its beam passage. Advantageously the electrode elements may be configured to form a particle optical lens in conjunction with the magnetic field within the passage opening at the gap(s), wherein optical parameters, e.g. focal length, of said particle optical lens are adjustable even further through modifying the electric potentials applied to the electrode elements.

According to a suitable geometric layout the yoke body may extend between and thus form the two axial ends of said beam passage; in particular the first component, e.g. inner yoke shell, may extend from the beginning to the end of a central portion of the passage, but keeping said gaps open at either ends towards the second component, e.g. the outer yoke shell, which surrounds the inner yoke shell radially and axially, preferably extending to either sides thereof; the yoke components may thus form a geometry of two hollow cylinders, concentrically nested. Thus, the inner yoke shell surrounds at least parts of the sleeve insert; the gaps of the magnetic circuit respectively induce a magnetic field which, reaching inwards into the passage opening, shall overlap with the electric fields generated by electrode elements of the sleeve insert, which allows to establish an electromagnetic lens. Such electromagnetic ultra-fine-tuned lenses can enhance the precision down to 1 ppm-5 ppm accuracy range with respect to the designed properties. For instance, the focal length of such electromagnetic lens(es) is adjustable during operation, i.e. during times when a charged particle beam is passing through, by modifying the electric potentials applied to the electrode elements.

In many embodiments, the sleeve insert may also comprise a ceramic body on which the electrode elements are realized as conductive coatings of respectively limited shape and area.

Electrode elements may often be configured (mechanically and electrically) to form at least one Einzel lens; furthermore, in many embodiments of the invention, at least one of the electrode elements may include an electrostatic multipole electrode comprising a number of sub-electrodes arranged uniformly around the longitudinal axis along a circumferential direction, enabling the lens to deflect or shape the charged particle beam traversing said electrode elements, where the electric potential applied to the sub-electrodes of this element may be defined to form electrical multipole fields.

In many embodiments of the lens of the invention, in particular in those cases where the lens is intended to be used in connection with a pattern definition system (PD), among the electrode elements may be a beam aperture element forming a delimiting opening with a defined radius around the longitudinal axis, the delimiting opening limiting the lateral width of a charged-particle beam propagating through the passage. This delimiting opening may be used as a calibration aperture, enabled for collecting particles, including those intentionally deflected in a pattern definition system meant to prevent particles from reaching the target of the charged particle beam. Furthermore, for example the beam aperture element may be connected to a current measurement device, which may be used to measure the amount of the charged particles absorbed at the beam aperture element. In front, i.e. upstream, of such a beam aperture element, it is advantageous to have an electrostatic multipole electrode, configured to determine a transversal position of the beam with respect to the longitudinal axis, by applying different suitable electrostatic potentials to the subelectrodes and thus scanning the beam across the aperture.

Preferably the charged particle lens may have an overall rotationally symmetric shape along said longitudinal axis, wherein the components of the magnetic circuit assembly are arranged coaxial with said longitudinal axis and preferably have basic shapes corresponding to hollow cylinders or hollow polygonal prismatic shapes.

In contrast to known magnetic lenses such as shown in U.S. Pat. No. 9,165,745, the electromagnetic lens of the invention has a magnetic loop which is completely closed except only for a number of "air gaps" in the housing body, which allow to deploy the magnetic field at desired regions of the optical axis, thus having diminished influence due to stray fields (existing in single gap systems according to Ampere's circuit law) acting negatively on the performance of the electromagnetic lens as employed in charged particle multi-beam nano-patterning apparatuses. Thus, in order to minimize stray fields present in the above mentioned state-of-the-art systems it is highly advantageous to provide (at least) two gaps. However, it will be clear that the number of gaps may be higher, such as three or four or more, depending on the individual application of the lens.

For at least the above reasons, the present invention and its application in writer tools such as multi-column multi-beam charged particle nano-patterning systems (e.g. for direct writing of substrates), offer a unique combination of magnetic, electrical and calibration components, which is expected to significantly impact the development of high-throughput industrial processes for integrated circuits. This invention significantly facilitates layout, construction, fine- and even ultra-fineadjustments for controlling of writer tools, and in particular of a multi-column multibeam mask-writers too.

A further aspect of the invention is directed at a charged particle optical apparatus including a charged particle lens according to the invention (including an electromagnetic lens according to the invention) and configured for influencing a charged particle beam of said apparatus propagating through the lens along the optical axis thereof, wherein said lens is part of an particle optical system of said apparatus suitable for magnetic lenses. In particular, the apparatus may preferably be realized as a multi-column system comprising a plurality of charged particle optical-columns, each column using a respective particle beam and comprising a respective optical system which includes a respective lens of the invention.

BRIEF DESCRIPTION OF THE DRAWINGS

In the following, in order to further demonstrate the present invention, illustrative and non-restrictive embodiments are discussed, as shown in the drawings, which show schematically:

FIG. 2 shows an embodiment of a symmetric ring shaped shunting device, including a shunting component and a holder, configured for shunting a magnetic lens of FIG. 1A; FIG. 2A shows a cut-open view of the device, while FIG. 2B shows a cross-section, to illustrate how a shunting device can be mounted within a lens of FIG. 1A;

FIG. 6 depicts three schematic magnetic circuit diagrams according to respective embodiments of the invention; wherein FIG. 6A and FIG. 6B show symmetrically shunted magnetic circuits and FIG. 6C an asymmetrically shunted magnetic circuit;

DETAILED DESCRIPTION OF EMBODIMENTS OF THE INVENTION

Figures 1, 1A, 1B:
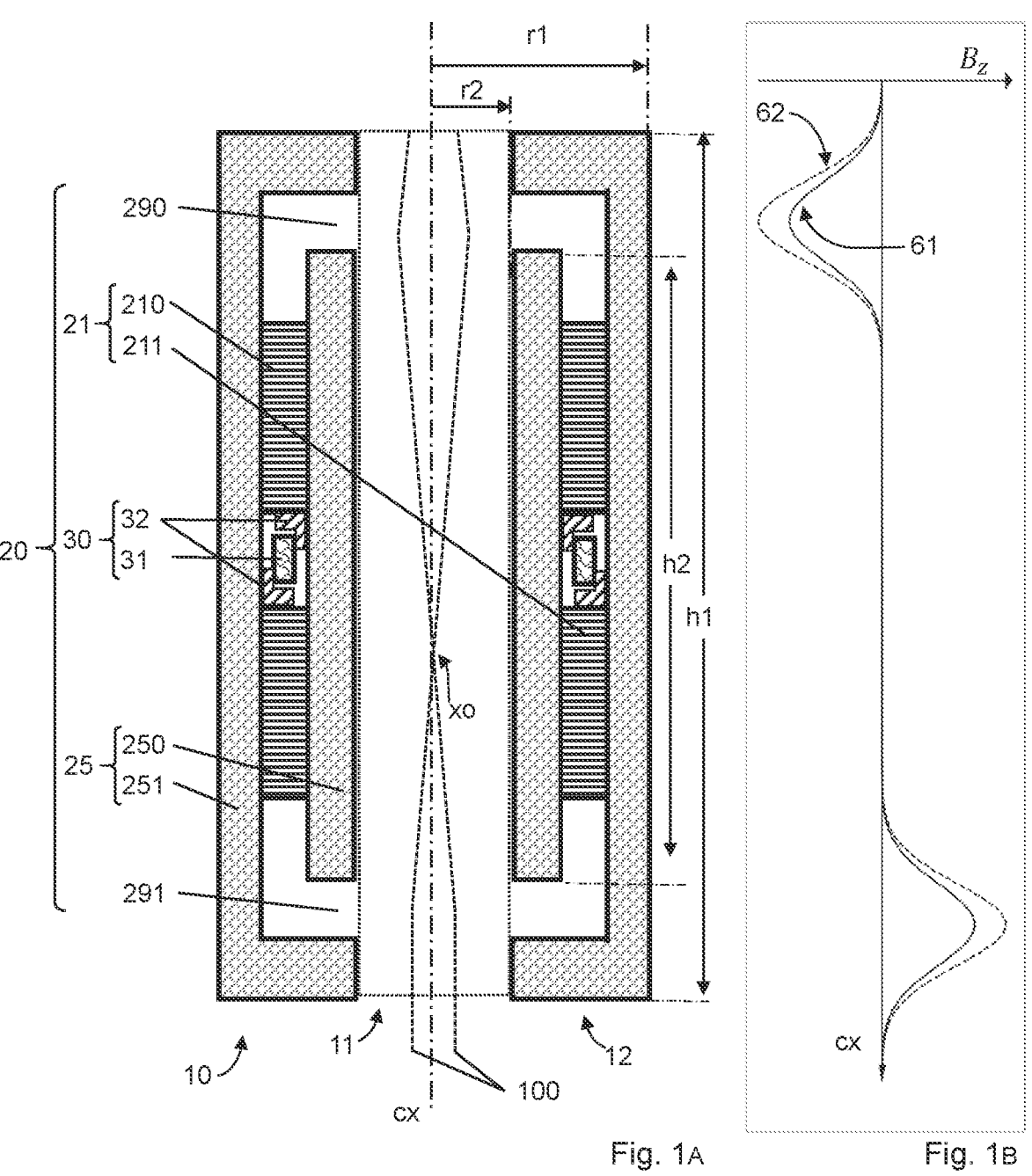
FIG. 1 illustrates a charged particle lens according to a first embodiment of the invention, where FIG. 1A (to the left of the drawing) is a longitudinal sectional view of the charged particle lens.
FIG. 1B is a plot of the strength of the axial component of the magnetic field, without (dashed line) and with a shunting device (solid line), measured at the location of the central axis as a function of the longitudinal coordinate of FIG. 1A.

The detailed discussion of exemplary embodiments of the invention given below discloses the basic ideas, implementation, and further advantageous developments of the invention. It will be evident to the person skilled in the art to freely combine several or all of the embodiments discussed here as deemed suitable for a specific application of the invention. Throughout this disclosure, terms like "advantageous", "exemplary", "typical", "preferably" or "preferred" indicate elements or dimensions which are particularly suitable—but not essential—to the invention or an embodiment thereof, and may be modified wherever deemed suitable by the skilled person, except where expressly required. It will be appreciated that the invention is not restricted to the exemplary embodiments discussed in the following, which are given for illustrative purpose and merely present suitable implementations of the invention. Within this disclosure, terms relating to a vertical direction, such as "upper" or "down", are to be understood with regard to the direction of the particle-beam traversing the electromagnetic lens, which is thought to run downwards ("vertically") along a central axis (or longitudinal axis). This longitudinal axis is generally identified with the Z direction, to which the X and Y directions are transversal.

For increasing throughput in high-volume industrial manufacturing, with particular regard for mask-less lithography and direct-writing on substrates (e.g. wafers), there is the need to increase the electrical current carried by the charged particle beam passing through the charged particle nano-pattering apparatus; this is usually at the cost of limiting the resolution due to Coulombic interactions between the charged particles and will require a corresponding compensation by reduction of the magnitude of the optical aberrations introduced by the apparatus through other mechanisms. To this end, the applicant has developed a charged particle multi-beam apparatus consisting of multiple parallel optical columns combined in a multi-column fashion, each column having a reduced ("slim") cross-section diameter, as compared to earlier writer setups such as eMET.

Such a multi-column apparatus (one embodiment is discussed below referring to FIG. 15) enables significantly larger electrical currents with the charged particle beams, while overcoming the limitations due to the trade-off between electrical current and optical aberrations found in single-column systems. This is due to the fact that the total current delivered to the target is split into multiple optical axes, while the resolution limitation is dominated by the amount of current per axis. Single columns of this type are well known in prior art, such as U.S. Pat. No. 6,768,125, EP 2 187 427 A1 (=U.S. Pat. No. 8,222,621) and EP 2 363 875 A1 (=U.S. Pat. No. 8,378,320) of the applicant.

A typical multi-column system includes multiple optical sub-columns, each of which comprises an illuminating system that delivers a broad telecentric charged particle beam to a pattern definition system followed by a charged particle projection optics, which for example includes a multitude of electrostatic, magnetic, and/or electromagnetic lenses.

For using such a system as a high-throughput wafer-direct-writer it will be necessary to place a substantial number of columns above one semiconductor wafer, e.g. in the order of one hundred columns. However, this setup limits the radial dimension of each column to a diameter of just a fraction of the width of the full wafer; for instance in the case of a typical 300 mm (12") wafer, a diameter of roughly 30 mm may be used. Slim-diameter magnetic lenses, on the other hand, cannot be realized by coil-based magnetic lenses, because reduction of the column diameter would correspond to extremely large Joule heating due to the large electrical currents needed to operate the coils to generate sufficiently strong magnetic fields; however, there is insufficient space for an adequate temperature-control system, including high-precision sensors and isotropic and homogeneous cooling, which would be required for conventional coil-based magnetic lenses.

The mentioned limitations driven by heat-related and geometrical requirements are severe, but can be overcome by employing magnetic lenses based on permanent magnets together with a magnetic permeable yoke body for directing the magnetic flux and thus generating a magnetic field, such as the possible embodiments of the present invention. However, such permanent magnets cannot be tuned much after completion of manufacturing and assembly, therefore their applications in magnetic lenses are limited. This represents a serious disadvantage with respect to coil-based magnetic lenses, whose magnetic field can be controlled by adjusting the electrical current passing through the coils. Especially given inherent limitations on the precision of the targeted magnetic field due to manufacturing and assembly, accuracies of magnet manufacturers are vital for operational purposes of a magnetic lens comprising such magnets; current precision limitations correspond to a deviation of approximately 1%-5% to the targeted magnetic field; the strength of the magnetic field is in the order of 1 T.

The mentioned deviations are due to tolerances and statistical uncertainties of manufacturing, which are virtually unavoidable for a manufacturing process having a reasonable yield of magnetic lenses for high-volume production. The present invention offers a new approach for compensating these deviations, by including additional components that allow tuning the magnetic field during the assembly of said lenses. The invention removes the burden of (unrealistic) precision in manufacturing permanent magnets for the use in magnetic lenses, and in effect increases the usage spectrum of permanent magnetic materials usable for high-precision systems, as the applicants invention is able to compensate deviations of an actual permanent magnet from a desired nominal magnetic field strength, and can even allow higher deviations, as long as geometrical parameters of the system are still within specifications.

In-situ, i.e. during operation of said apparatus, tuning of charged particle lenses based on permanent magnets is typically done by deploying them in combination with one or more additional electric lenses; i.e. forming a charged particle electromagnetic lens, such as magnetic lenses based on permanent magnets together with electrostatic elements for fine-adjustment. U.S. Pat. No. 9,165,745 discloses a permanent-magnet-based electromagnetic lens combined with a coil-based magnetic lens for fine adjustment, which can tune the magnetic field, but has at least those above-mentioned heating and geometrical problems not suitable for at least some of embodiments of this invention. Furthermore, the magnetic field of the above state-of-the-art magnetic lenses is insufficiently confined to the space of the charged particle lens itself, causing severe cross-effects in the case of a large number of lenses arranged side by side in a multi-column system.

Charged Particle Lens

FIG. 1A depicts an charged particle lens (10) according to a first embodiment of the invention, in a longitudinal sectional view, i.e. along a section plane passing through its central axis (cx). For the sake of better clarity, the components are not shown to size. The lens may be used to implement a lens (10) of the writer tool (1) of FIG. 14 or multi-column writer tool (40) of FIG. 15 (see below), where it is used as an objective lens, but it will be appreciated that it is suitable for use in many other particle optical devices which may implement a single-column or multi-column architecture, e.g. as disclosed in U.S. Pat. Nos. 9,443,699 and 9,495,499 of the applicant, and the disclosure of those documents are herewith included by reference into the present disclosure.

The charged particle lens (10) includes a beam passage (11) for a charged particle beam (100) traversing the assembly, and a magnetic circuit assembly (20), which comprises at least one permanent magnet (210, 211), a yoke body (25) with at least two gaps (290, 291) and a shunting device (30). The mentioned magnets are made of a permanent magnetic material, typically with a remanence of about 1 T and a magnetic flux, symbolically denoted as $\Phi_0$; the yoke body (25) comprises two yoke components (250, 251), of which the outer yoke shell (251) also serves a housing body (12) for the lens, and are made of a high magnetically permeable material; the yoke components form at least two gaps (290, 291) at two different axial positions, at which the magnetic flux streaming through the circuit assembly will induce a magnetic field reaching into the beam passage (11); and lastly, the shunting device (30) comprises at least one shunting component (31), made of high magnetically permeable material, and a specific holder (31), configured for positioning the component in a space between said yoke components. The shunting component allows bypass of a flux Ps, which is a defined portion of the magnetic flux Po. Depending on the strength of magnetic lensing effect the charged particle beam (100) may also form a cross over (xo) in said beam passage (11), i.e. the beam reaching a minimal lateral width while crossing the central axis (cx); the dotted lines symbolize an envelope of a charged particle beam as it propagates through the lens if deployed in an exemplary particle beam exposure system (such as the writer tool (1) of FIG. 14 or multi-column writer tool (40) of FIG. 15).

Figures 10, 10A, 10B:
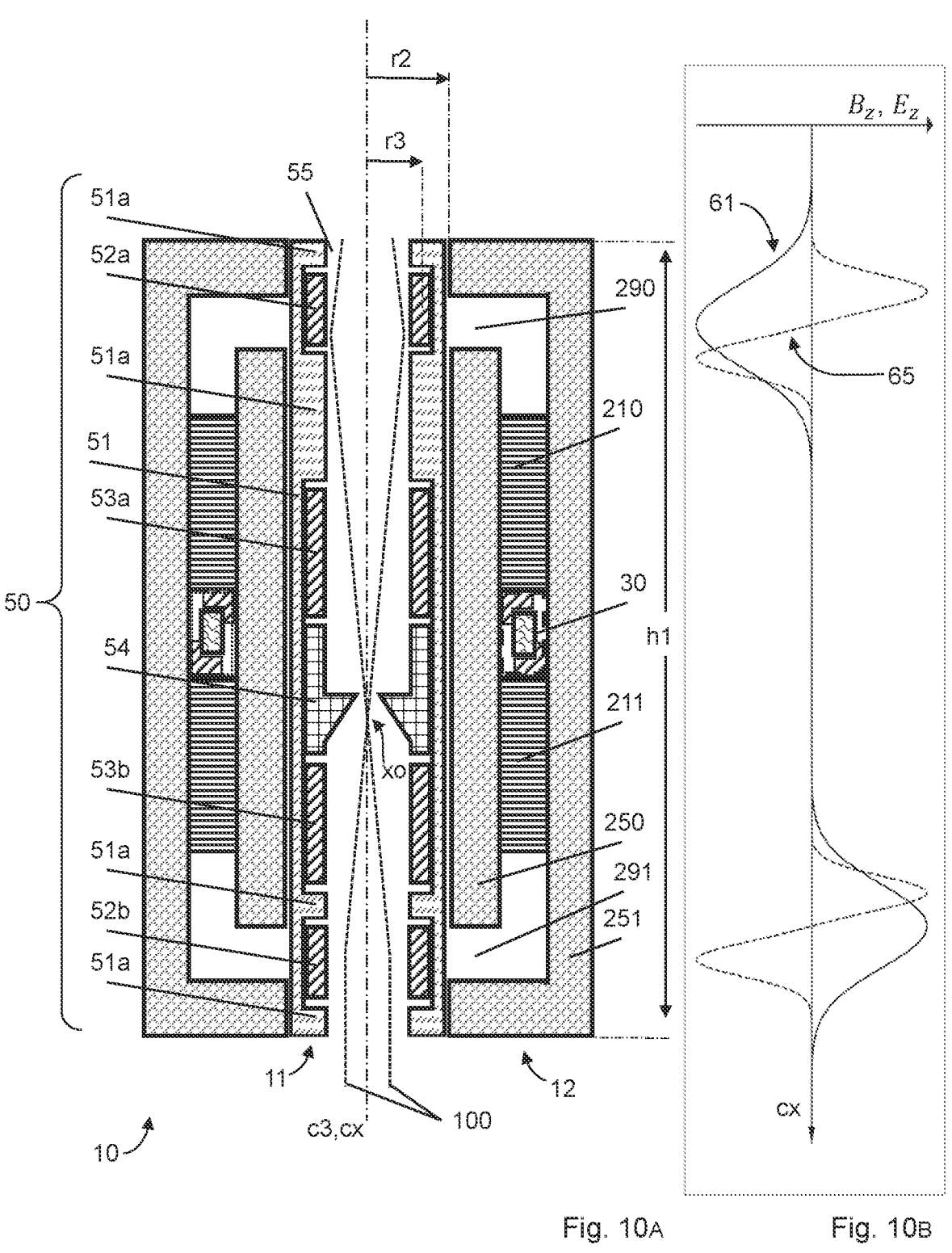
FIG. 10 illustrates a charged particle lens according to a further embodiment of the invention including a sleeve insert, where FIG. 10A (to the left of the drawing) is a longitudinal sectional view of the charged particle lens and the electrical sleeve insert therein, forming an electrostatic lens system.
FIG. 10B is a plot of the strength of the axial component of the magnetic field (solid line) of said shunted magnetic lens and the electric field (dashed line), measured at the location of the central axis as a function of the longitudinal coordinate of FIG. 10A.
Figures 15, 15A, 15B:
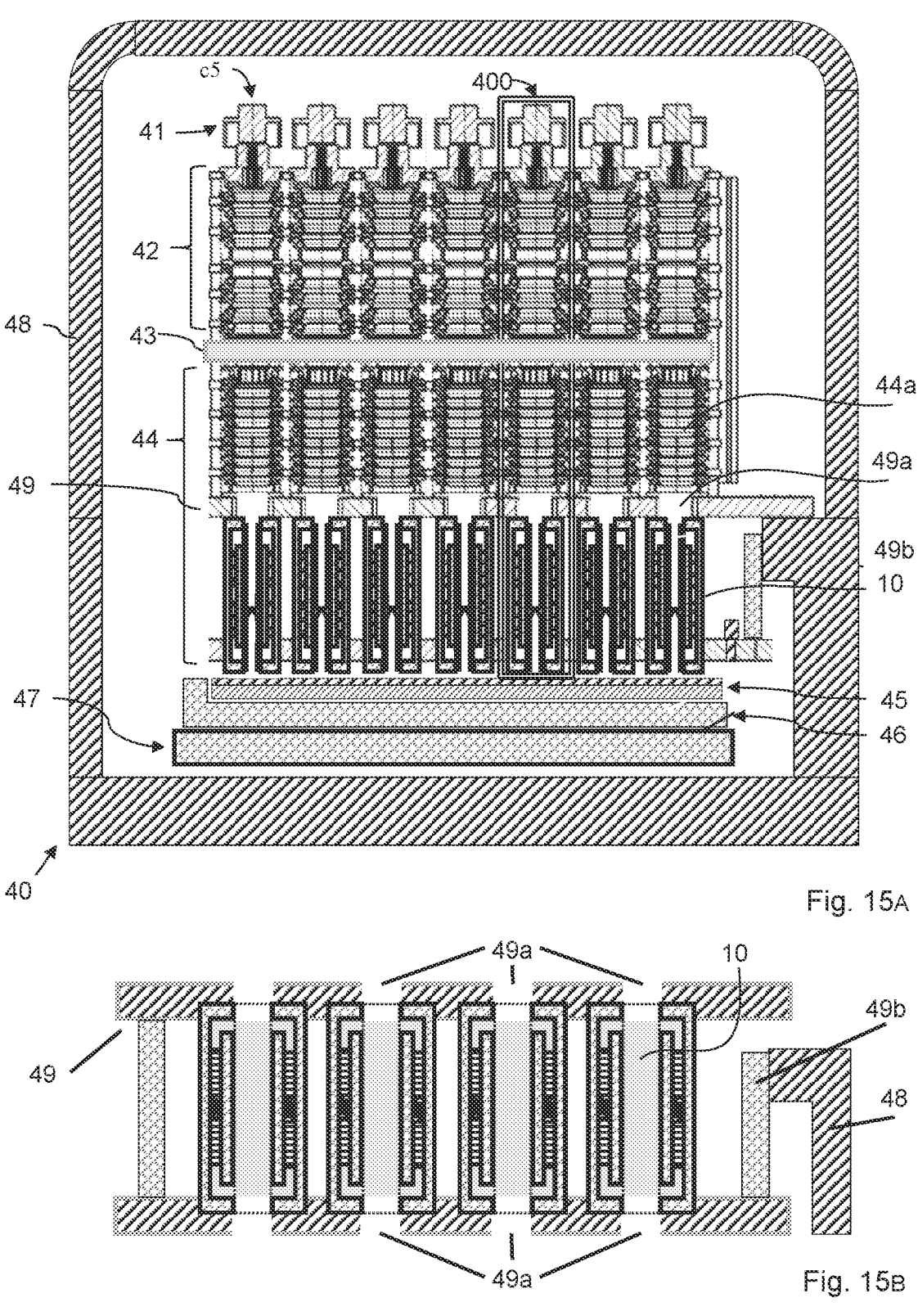
FIG. 15 illustrates a multi-column writer tool incorporating a plurality of instances of the lens of the invention, where
FIG. 15A is a longitudinal sectional view of the multi-column writer tool.
FIG. 15B is a detail view of the portion comprising said lenses and including an embodiment of a multi-lens holder device.

In typical embodiments the charged particle lens (10) may have exemplary dimensions of overall height (h1) of about 50 mm to 100 mm and an inner height (h2) of about 10 mm to 100 mm, typically smaller than the overall height (h1), therefore enabling a design where an outermost yoke component (251, also referred to as outer yoke shell) serves as a housing and shielding body for the lens assembly, and outer radius (r1) of about 10 mm to 20 mm, enabling deployment in a multi-column writer tool (40) of FIG. 15, and an aperture radius of (r2) of about 0.1 mm to 5 mm, i.e. wide enough to enable a charged particle beam passage and may even allow for further inserts (see FIG. 10 below). Said magnets, gaps and shunting device typically are about 1 mm to 5 mm thick, and the yoke components may have similar dimensions in radial thickness. The sizes of the components are chosen as suitable for the respective application and charged particle apparatus; in the shown embodiments the geometric dimensions are typically in the order of several millimeters.

The charged particle lens (10) is usually arranged in a particle beam exposure system in a way that its central axis (cx) coincides with the optical axis (c5) of the exposure system (cf. FIG. 14); but the skilled person will appreciate that also other relative arrangements may be chosen depending on the application of the charged particle lenses according to the invention.

Magnetic Circuits and Shunting Devices

According to the invention, a magnetic circuit assembly (20) and the corresponding magnetic lenses include at least one shunting device (30), which comprises a shunting component (31), placed on a specific holder (32) (FIG. 2) within the assembly. The shunting device enables a defined portion $\Phi_S$ of the initial magnetic flux Po to bypass the gaps (290, 291) and thus reduce the flux density in said gaps. A shunting component is made of high magnetically permeable material, typically in the same order of magnitude of the yoke components (250, 251) in the close vicinity of the device. Shunting devices according to the invention enable the reduction of magnetic fields in said gaps. The effect is plotted in FIG. 1B, showing the axial component of the magnetic field $B_z$ along the central axis (cx) of a magnetic lens: a solid curve (61) for the shunted element and a dashed curve (62) for an un-shunted lens of the same dimensions. One can see a reduction of the maximal field strength, and also the field being confined to the region of the gaps, where it forms magnetic lens. Conventional permanent magnetic lenses can reach an accuracy within 1% to 5% range of the targeted magnetic field strength, due to manufacturing ranges of the permanent magnets deployed in such systems. Using shunting devices according to the invention it is possible to lower this range to accuracies within 0.1% to 0.5% around the targeted effects, which provides deviations from the desired magnetic fields that are by an order of magnitude smaller and thus distinctly better performance.

FIG. 2 illustrates an exemplary embodiment of a shunting device (30), which may comprise a shunting component (31) placed on holder (31), both being a ring-shaped elements (see FIG. 2A), with a common central axis (c2), which will preferably coincide with the central axis (cx) of a lens assembly. The shunting device is typically placed in close vicinity of the two or more permanent magnets (210, 211) and between the yoke components (250, 251) (see FIG. 2B);

where it may have to be deployed during the assembly of the lens, since the position is rather encapsulated; nevertheless, the shunting device could also be added after a first assembly, provided suitable technical solutions are used, e.g. partial disassembly, or the device being constructed of replaceable modules within the lens (see below).

Figure 3:
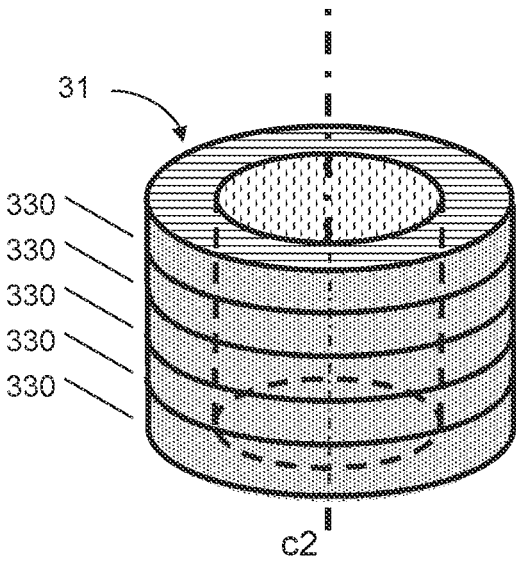
FIG. 3 shows an embodiment of a shunting component composed of several stacked layers.
Figure 4:
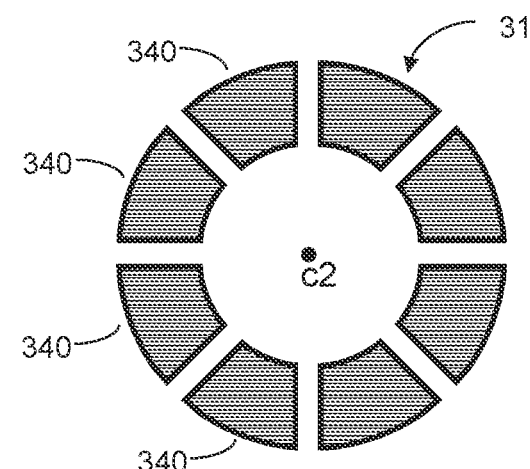
FIG. 4 shows an embodiment of a shunting component composed of several sectors.
Figure 5:
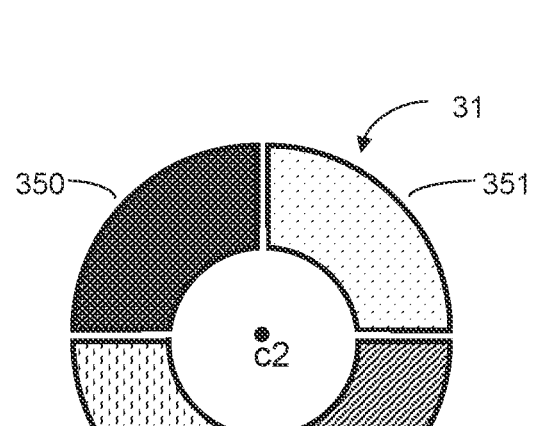
FIG. 5 shows an embodiment of a shunting component composed of sectors with materials of varying magnetic permeability, enabling said component to have asymmetric properties with respect to the central axis.

Referring to FIGS. 3 to 5, in some embodiments of this invention a shunting device's (30) shunting component (31) may be composed of sub-components (330, 340, 350) arranged along or around a common axis (c2), which for example can coincide with a central axis (cx) of a full lens assembly. Said sub-components may be layers (330) (FIG. 3), where the shunting component (31) is assembled as a stack, or sectors (340) (FIG. 4), where the shunting component is assembled as a composite ring-shaped element. The sectors (350-354) may also comprise different materials with varying high magnetic permeability (FIG. 5); enabling a shunting component of varying magnetic resistance and thus local variations of flux density in said assembled component (31). Such variations in magnetic permeability of shunting elements may be associated with magnetic multipoles in said magnetic lens assemblies, which may be used to intentionally introduce such azimuthal dependencies; this may be used, for example, to counteract permanent magnets imposing multipole like features. On the other hand, if regions may have much lower permeabilities, e.g. $\mu_{r,350} \approx 1$, the shunting component can be described as "sparse". Generally, these sectors do not have to be equally distributed around the central axis (c2).

Magnetic circuit assemblies can be represented in magnetic circuit diagrams (FIG. 6A-6C), which give insight on a generalized case of the invention, i.e. a rotationally symmetric system with primarily constant properties of each sub-component of the lens, e.g. element thickness, magnetic properties (permeability). If so, the magnetic reluctance $R_i$ of an element (index i) with length $l_i$, a primary cross section $A_i$ and a constant magnetic permeability $\mu_{r,i}$ can be calculated as $$R_i = \frac{l_i}{\mu_0 \mu_{r,i} \cdot A_i}$$

where $\mu_0$ is the vacuum permeability.

A permanent magnet may introduce a constant flux $\Phi_0$ of which one can derive a flux $\Phi_i$ through element i from $$\Phi_i = \Phi_0 \cdot \frac{R_i}{R_{tot}}$$

where $R_{tot}$ is the total reluctance the flux Po will see.

Furthermore a magnetic field $B_i$, i.e. defined as a flux density, within said element i may be calculated as $$B_i = \frac{\Phi_i}{A_i}$$

which, in the case iff the material is "vacuum", we can finally combine the equations above and yield a magnetic field within vacuum ($\mu_{r,i}=1$) of $$B_i = \Phi_0 \cdot \mu_0 \cdot \frac{l_i}{R_{tot}} \text{(in vacuum gaps)}$$

For the vacuum gaps ($290$, $291$) we can thus derive, that a strength $B_i$ of a magnetic field may be reduced by increasing the total reluctance $R_{tot}$ of the assembly, which is the purpose a shunting device ($30$)—while we keep in mind the assumptions and simplifications done to derive this simplified equation are limiting the accuracy, but rather give an estimate of the dependencies.

We depict three exemplary cases of possible shunting methods, of which the skilled person will appreciate that also other relative arrangements may be chosen depending on the application of the charged particle lenses according to the invention. In FIGS. 6A-6C, for better clarity and legibility, components of the magnetic circuit are denoted by reference symbols equal to those of the corresponding components of FIG. 1A (for instance, 250 and 251 refer to the yoke components), and in the following magnetic quantities, such as magnetic flux-and magnetic reluctances R are denoted using the respective reference symbol as index. In addition, the yoke components 250 and 251 are, in the magnetic circuits of FIGS. 6A-6C, split into four portions respectively, denoted by additional indexes a to d (i.e., 250a-250d and 251a-251d); moreover, the vacuum gaps 290, 291 correspond to magnetic resistances represented by zigzag resistor symbols.

The exemplary magnetic circuit ($20a$) illustrated in FIG. 6A comprises two permanent magnets ($210$, $211$) of similar initial flux (i.e. $\Phi_0 \approx \Phi_{210} \approx \Phi_{211}$ and $\Phi_{21} = \Phi_{210} + \Phi_{211}$), two yoke components ($250$, $251$) of similar cross section A and permeability $\Box$(i.e. $A_{250} \approx A_{251}$ and $\mu_{r,250} \approx \mu_{r,251}$), two gaps ($290$, $291$) of similar size (i.e. $l_{290} \approx l_{291}$ and $A_{290} \approx A_{291}$, which yields $R_{290} \approx R_{291}$) and one shunting device ($30$) with a shunting component ($31$) of magnetic reluctance $R_{31}$. The shunting device ($30$) is placed symmetrically between the magnets, which are also symmetric in position within the yoke components, thereby giving values of $R_{250b} \approx R_{250c} \approx R_{251b} \approx R_{251c}$ and likewise $R_{250a} \approx R_{250d}$, $R_{251a} \approx R_{251d}$, and $R_{250} = \Sigma R_{250,x}$ and $R_{251} = \Sigma R_{251,x}$, where the summation is over $x \in$ (a, b, c, d). We obtain an estimation value of the magnetic field in the vacuum gap ($290$) of $$B_{290} = \mu_0 \cdot l_{290} \cdot \frac{\Phi_{21}}{R_{tot}}$$

wherein $R_{tot} = (R_{250} + R_{251}) + (R_{290} + R_{291}) + R_{31}$, where the magnetic reluctance $R_{31}$ of the shunting device ($30$) with primary magnetic permeability $\mu_{r,31}$, cross section $A_{31}$ and length $l_{31}$, is calculated as $$R_{31} = \frac{l_{31}}{\mu_0 \mu_{r,31} \cdot A_{31}}.$$

In the above, the symbol "~" is meant to denote an equality within a predetermined tolerance, such as a tolerance of about 2% or 5% or the like.

In many embodiments a symmetric lens assembly is of special interest. Each magnetic field of a radially symmetric magnetic lens composition comprises an axial component and a radial component $B = B_r + B_z$; while the radial component $B_r$ is of little importance, the resulting axial component $B_z$ of the magnetic field (e.g. $B = B_{290}$) is exploited for the lens effect. The strength ($61$) of the axial component of the magnetic field at the location of the central axis (cx) as a function of the longitudinal coordinate is depicted in FIG. 1B (solid line); a typical value of the peak value of the axial magnetic field $B_z$ is in the order of 0.1 T, in applications where the charged particles are electrons. As explained above a magnetic circuit will generate two regions near the gaps ($290$, $291$) of (comparatively) high magnetic field intensity, which will act as two consecutive magnetic lenses with well-defined focal lengths and optical aberrations in the beam passage ($11$). Magnetic coupling of the two lenses via a common yoke body ($25$) strongly reduces the effect of magnetic stray fields in any other regions, which would otherwise be inevitably associated with permanent magnets in particle lenses of conventional layouts.

In another exemplary embodiment, illustrated in FIG. 6B, the magnetic circuit ($29b$) comprises one permanent magnet ($210$), two yoke components ($250$, $251$), two gaps ($290$, $291$), and two shunting devices comprising two shunting components ($31a$, $31b$). We can again calculate the reluctance of each shunting device ($31a$, $31b$) as $$R_{31,x} = \frac{l_{31,x}}{\mu_0 \mu_{r,31,x} \cdot A_{31,x}}$$

(where x stands for either a or b). This assembly can then be symmetric, if again $R_{250b} \approx R_{250c} \approx R_{251b} \approx R_{251c}$ and furthermore $R_{250a} \approx R_{250d}$, $R_{251a} \approx R_{251d}$ and finally $R_{250} = \Sigma R_{250,x}$ and $R_{251} = \Sigma R_{251,x}$, where the summation is over $x \in$ (a, b, c, d); or it is asymmetric, if for example the shunting devices reluctances are not equal, i.e. $R_{31,a} \# R_{31,b}$. We will then get an asymmetrically shunted lens (see below), where the fields at the gaps ($290$, $291$) is not symmetrically reduced by the shunting devices.

Further, in another exemplary embodiment illustrated in FIG. 6C, such an asymmetric effect may be used to tune asymmetric permanent magnets, i.e. $\Phi_{210} > \Phi_{211}$. For instance, the at least one shunting element ($30$) may be placed in the magnetic circuit assembly ($20c$) at a position in the circuit which enables a bypass of mainly $\Phi_{210}$ with respect to $\Phi_{290}$ (i.e., the flux through the gap $290$) and has limited effect on $\Phi291$ (i.e., the flux of the other gap $290$).

Figures 7, 7A, 7B:
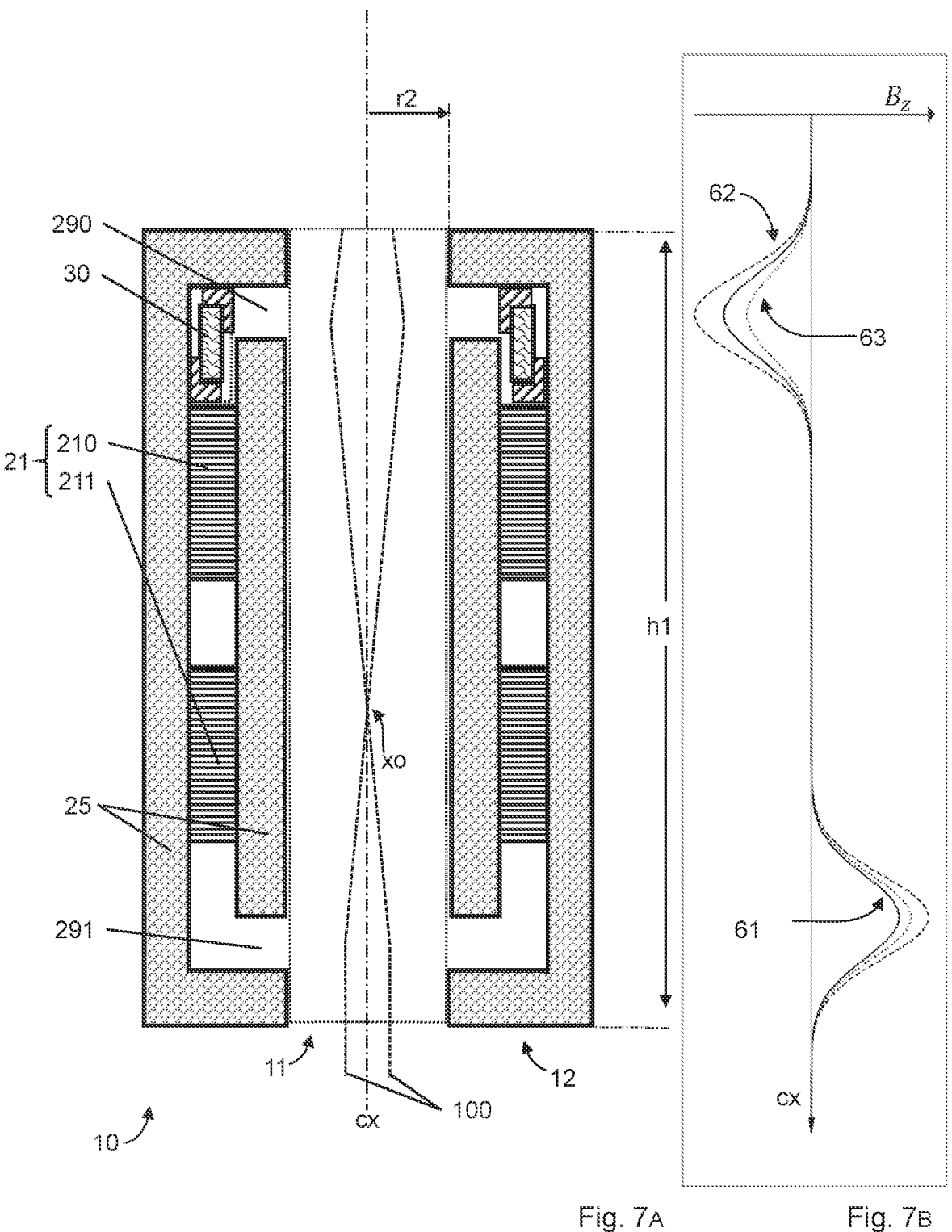
FIG. 7 illustrates a charged particle lens according to another embodiment of the invention, which has asymmetrically placed shunting devices respect to the longitudinal coordinate of the lens, where FIG. 7A (to the left of the drawing) is a longitudinal sectional view of the charged particle lens.
FIG. 7B is a plot of the strength of the axial component of the magnetic field without shunting (dashed line), with symmetric shunting (61, solid line) and with asymmetric shunting (dotted line), measured at the location of the central axis as a function of the longitudinal coordinate of FIG. 7A.

In some embodiments of this invention it may be useful to have asymmetric shunting device positions with respect to the longitudinal symmetry of a magnetic lens (see FIG. 7A). Advantages of an asymmetric shunting layout will be explained using the circuit diagram ($20c$) of FIG. 6C. The shunting device ($30$) includes a shunting component ($31$) which is placed not in a symmetric position with respect to the longitudinal symmetry of the lens, but closer to one of the at least to gaps (e.g. closer to gap $290$). The shunting will then yield an greater reduction of magnetic field strength in that gap ($290$). This is further depicted in the plot of FIG. 7B, which shows the effect as the axial component of the magnetic field along the central axis (cx) of the magnetic lens device of FIG. 7A; namely, a solid curve ($61$) for the symmetrically shunted lens (comparable to FIG. 1B), a dashed curve ($62$) for an un-shunted lens of the same dimensions and a dotted curve ($63$) for the asymmetrically shunted lens of this embodiment of the invention. One can see that the reduction of the maximal field strength is greater at the gap which is closer to the shunting device, and also the field in the other gap is reduced too, albeit to less extent. This asymmetric shunting can be used in order to induce localized effects of shunting to the addressed gap ($290$), and/or to counteract unintended intrinsic asymmetries of the permanent magnets used, e.g. if the upper magnet ($210$) has a larger magnetization, i.e. deviation much farther from the targeted value, which would cause the upper gap ($290$) to yield a larger magnetic field than intended if it were not corrected by the shunting according to the invention.

Multiple permanent magnets (210, 211) may be used in many suitable embodiments. For instance, they may be preferably arranged in a stacking along the longitudinal axis of the system, where in some of those embodiments there may be used multiple shunting devices (30) on several holder devices, said elements may also being placed in positions between multiple permanent magnets along the longitudinal axis of the lens (FIG. 1A, 10A).

Permanent Magnets

The permanent magnets 210, 211 act as a source of the magnetic flux Φ in a magnetic circuit realized in the magnetic circuit assembly (20).

Figures 8, 8A, 8B, 9, 9A, 9B, 9C, 9D:
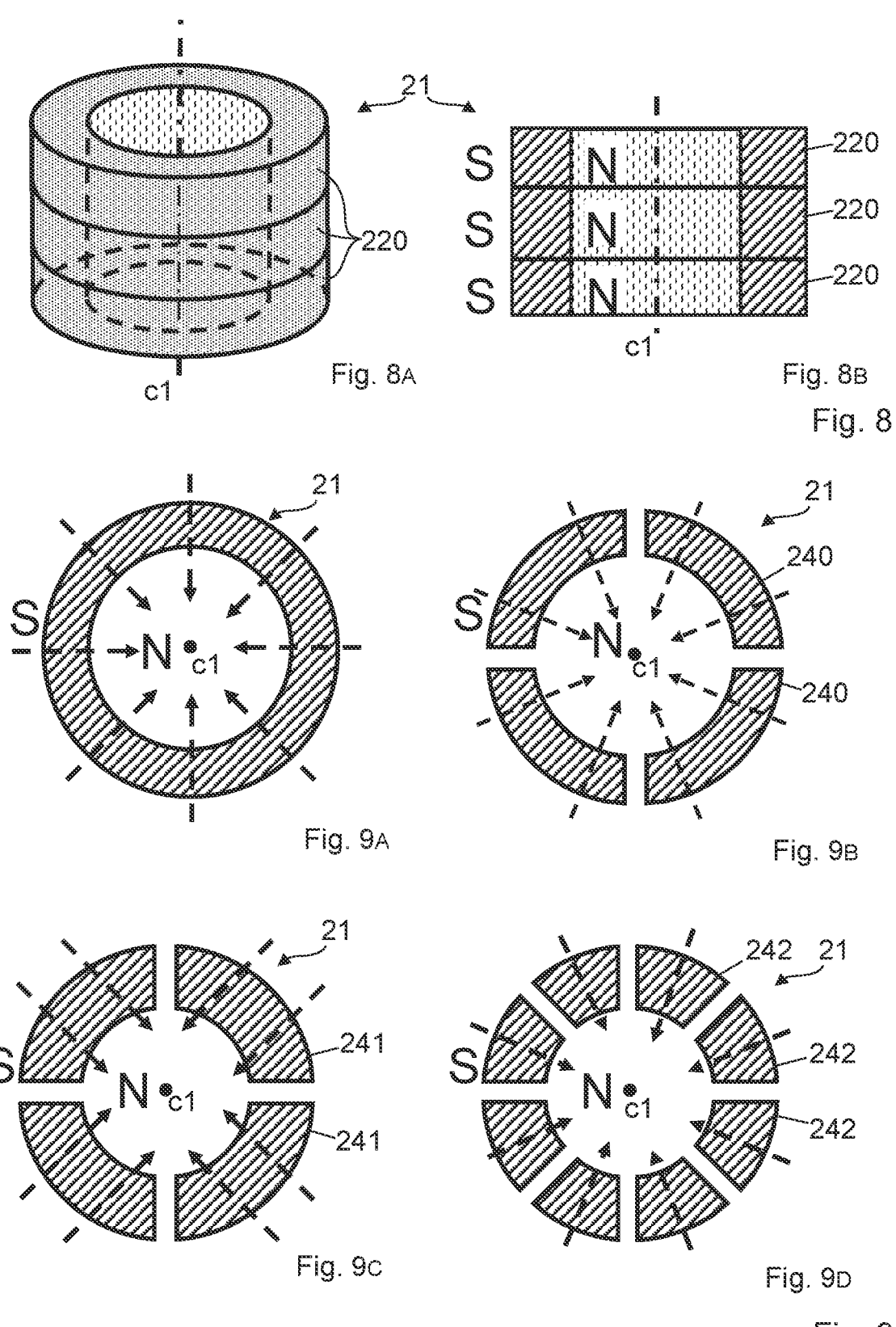
FIG. 8 shows an embodiment of a permanent magnet composed of ring elements having radial magnetization, in a perspective view (FIG. 8A), and a longitudinal section (FIG. 8B)
FIG. 9 illustrates several embodiments of permanent magnets in respective cross-sectional views, some of which are sectorized (FIG. 9B to FIG. 9D) and in variations of preferable magnetizations.

FIG. 8 illustrates one preferable embodiment of a permanent magnet (21) suitable for being used as a component of a magnetic circuit assembly of a lens according to the invention (e.g. as one of the permanent magnets (210, 211) of FIG. 1A). The magnet exhibits a primarily radial magnetization with a rotationally symmetric magnet. In FIG. 8, FIG. 8A is a schematic perspective view, and FIG. 8B a schematic sectional view along the longitudinal axis (c1) of the magnet (21).

In many embodiments and referring to FIGS. 9A-D, it may be useful that such magnets are composed of several sector parts. FIGS. 9A-D illustrate four exemplary variants of a ring magnet (21) having a net radial magnetization in respective schematic cross-sectional views, where the components of the ring magnet are shown exploded in FIGS. 9A,B,C for better clarity. This radial magnetization directions also yields the preferred positions of yoke components, i.e. inside and outside such ring magnets, picking up the flux from either pole of the magnet and directing it to the designed positions of the gaps (290, 291) between them (see FIG. 1A). Each of the magnet elements shall have said primarily radially oriented magnetization, as indicated by dashed arrows in FIGS. 9A-D, so as to have e.g. a "north" pole N formed towards the inner space of the ring magnet, whereas the outer sides have the "south" pole type S of the magnetization. Permanent magnet elements having radial magnetization as shown are commercially available, made of a ferromagnetic material such as sintered NdFeB, $SmCo_5$ or ferrite. The magnet elements (240, 241, 242) of the composite magnets of FIGS. 9A-C are joined by gluing or clamping or any other suitable means. The number of the magnet elements forming each ring magnet may be any number, such as one, two, three, four, six, or more, depending on the dimensions (in particular, height and radius) of the composite elements and the desired dimensions of the permanent magnet (21).

Furthermore, referring again to FIG. 8, in many embodiments the permanent magnet (21) may be realized as a ring-shaped component and comprise several layers of ring-shaped segment magnets (220) stacked along a common central axis (c1). In such a segmented magnet, each layer or segment contributes a portion $\Phi_{220,n}$ to the total flux $\Phi_{21} = \Sigma_n \Phi_{220,n}$ of a magnet comprised of n layers.

Housing Body

In many embodiments the yoke body (25) may also act as a housing (12) to the lens (10). The yoke body, comprised of an inner yoke component (250), which often and typically is realized as a hollow cylinder with an aperture radius (r2) and of sufficient length (h2) so that it exceeds at least the height of stacked permanent magnets and shunting devices; and an outer yoke component (251), which may then also be realized having a cylindrically symmetric shape of height (h1) with an aperture radius (r2) and outer radius (r1) wide enough to cover the thickness of each yoke component, and the magnets placed between them. Said outer yoke may advantageously have a double-"C"-shaped longitudinal cross section (FIG. 1A); in other words, the outer yoke comprises a central body portion shaped as a hollow cylinder, which may be concentric with a hollow cylinder of the inner yoke component, and furthermore having two end parts of disk-like shape with a central bore. Thus, the hollow space of the yoke components surrounds a beam passage (11) of radius (r2) and height (h1) along the longitudinal axis (cx). The gaps (290, 291) of the magnetic circuit are provided between the axial outer end faces of the inner yoke component and the corresponding axial inner faces of the outer yoke component, which then represent respective pole-pieces of the magnetic circuit (20). The radial thickness of the hollow cylinders is typically, and without loss of generality, in the order of a few millimeters and the height of the assembly in order of a few tens of millimeters. The inner and outer yoke component now forming the housing body of the lens, by virtue of their shape, can enhance and concentrate the magnetic flux generated by the magnets. The outermost yoke component also acts as a shielding for the magnetic flux in radial and axial directions, since the special shape and materials will accumulate the flux within the dimensions of radius (r1) and height (h1).

Electric Inlay

According to a further aspect of the invention as illustrated in FIG. 10, the charged particle lens (10) may beneficially comprise a sleeve insert or inlay (50), which is inserted into the beam passage (11) along the optical axis (cx) (FIG. 10A). Correspondingly, the physical dimensions of the inlay are appropriately chosen with respect to the dimensions discussed above, e.g. within a radius (r2) and a height (h1) of the lens. The inlay may comprise a number of beam control elements (52-54), including one or several electrically active elements that are employed to generate an adjustable electric field (65) (dashed line in FIG. 10B) superposing the shunted magnetic field (61) (solid line) in the beam passage. The strength of the electric field axial component $E_z$ (i.e. along longitudinal direction) will have a typical value of peak value in the order of 105 V/m.

In many embodiments of the inlay, the beam control elements (52-54) are generally ring-shaped components serving as electrically active elements, and they are stacked along the central axis (c3) and oriented with their geometric axes concentric and parallel to the central axis (cx) of the lens. In many embodiments of the invention it is useful to have all control elements with a common inner radius (r2); thus they define a passage opening (55) which transverses the lens and serves as a channel for the charged particle beam (100) during operation of the charged particle lens. Also, it can be useful to insert smaller aperture openings (54) for beam calibration (see below).

Figures 11, 12, 13:
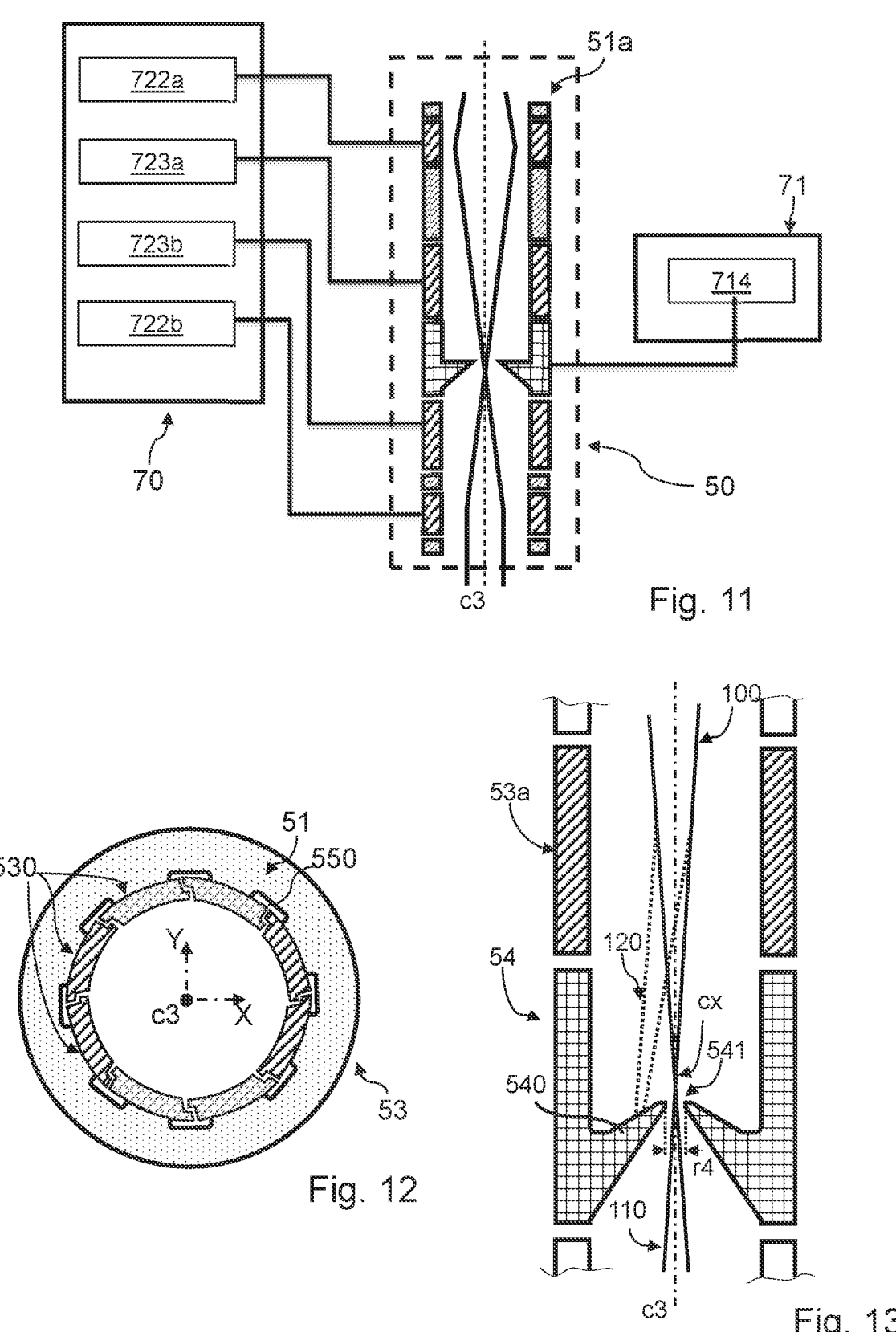
FIG. 11 is a schematic overview of the electric voltage supplies connected to the sleeve insert and its elements in one embodiment of the lens of FIG. 10A.
FIG. 12 shows a cross-sectional view of a multipole electrode having eight sub-electrodes.
FIG. 13 shows an enlarged detail of the calibration aperture and a preceding multipole as components of a sleeve insert of an electromagnetic lens of one embodiment of this invention.

In the embodiment shown in FIG. 10A the beam control elements realize two Einzel lenses (52a, 52b), and two multipole electrodes (53a, 53b)—all made of electrically conductive materials. For example, each of the multipole electrodes can be realized as a composite metallic ring, composed of multiple sections of equal arc length, for instance, and without loss of generality, 4, 6 or 8 sections, (see FIG. 12); their (radial) thickness is typically below 2 mm, and their lengths between 5 mm and 20 mm. In addition, preferably an electrically conductive ring-shaped aperture (54) is placed between the two multipoles (53a, 53b); this component is herein referred to as "calibration aperture". Electrically active elements may preferably be connected to their respective power supplies units (722a, 723*a*, 723*a*, 723*b*) as shown in FIG. 11, so that their electrostatic potentials can be individually adjusted; in a variant, the power supplies may be combined in a common multi-channel power supply device (70) which provides the individual supply voltages. The calibration aperture may be controlled by the power supply device (70) or a separate dedicated electric control device (71). Finally, the electrically active elements are electrically separated from each other and terminated at both ends by elements referred to as field termination caps (51*a*), whose electric potential is denoted as "local ground", i.e. the point of reference. The field termination caps serve to confine the electric field to the passage space of the inlay; they thus provide a well-defined "field boundary" of the inlay towards surrounding components (such as other particle-optical columns 400, see FIG. 15). Some spaces on the inlays mounting body (51) between the field termination caps and other electrical elements can also be electrically insulating, e.g. realized as vacuum or a filler material using a non-conductive, preferably voltage-resistant, material such as ceramics.

In many embodiments of this invention the various elements (52-54) of the inlay (50) are supported and held together by a mounting body (51) of hollowcylindrical shape (e.g. inner radius (r3) and outer radius (r2), with height (h1)), which can be generally made of electrically insulating material such as e.g. ceramic or plastic; yet at least portions (51*a*) facing the charged particle beam, may still be covered with electrically conductive materials and connected to a "drain", to avoid electrical charge-up. The electrode elements may be realized, for instance, as discrete ring-shaped elements (52*a*, 52*b*, 53*a*, 53*b*, 54) joined and held together within the body, or as conductive coatings (51*a*) formed at the inner surface of the ring body, so as to have respectively limited shape and area.

With the inlay, the accuracy of optical properties, e.g. the focal length of a charged particle lens (which is limited in precision of manufacturing of permanent magnets and shunting devices, and assembly accuracy limitations) can reach a precision of 1 ppm to 5 ppm around the target value-thus an "ultra-high precision" tuning is feasible. Some embodiments of this invention may also include integrated corrections means, which can be used to overcome limitations, e.g. relating to aging effects of magnets, since electric fields can be adjusted and controlled with a precision in the ppm (parts-per-million) regime during the use of the lens without de-assembly, i.e. "in-situ tuning". In addition, the voltages of the beam control elements can be adjusted in combination with other optically and electrically active elements of the system, in order to change the property of the particle beam exposure apparatus (1), for example with respect to optical properties, e.g. aberrations, image planes etc.

FIG. 12 shows a cross-section of a multipole electrode of the inlay. The multipole electrode comprises a number of rods (530), which can be controlled with individual electric potentials by means of their respective external power supply units (70). Additionally, a global offset voltage may be applied to have them behave as additional electrostatic lenses. By virtue of the different voltages applied to the individual rods various field configurations of dipole, quadrupole or higher order electrostatic fields can be realized, with the purpose of shaping the particle beam crossing their corresponding transversal section of the optical axis. With respect to a typical application in the context of the embodiment of FIGS. 10, the voltages applied to the rods are typically in the order of up to a few tens of volts. Such beam shaping can be used to compensate for errors due to imperfections of the optical system, such as magnetic inhomogeneities, mechanical manufacturing and/or assembly accuracies. In this respect, the multipoles can correct the beam position with respect to the optical axis (c3) when used as dipoles, whose directions in the plane defined by the X and Y axes (FIG. 12) can be arbitrary if at least four different voltages+V1 (hatched rods to the right hand side), −V1 (hatched rods to the left hand side), +V2 (cross-hatched rods to the top), −V2 (cross-hatched rods to the bottom) are applied to the rods. Additionally, it is possible to compensate for astigmatism or other higher-order distortions by the multipoles when the latter are used as quadrupole or higher-order multipoles, by applying suitable voltages at the individual rods, in a manner similar to the dipole case.

It should be remarked that any multipole electrodes could also be used as (quasi-) static or as dynamic elements, i.e. having time-varying voltages, depending on the application. The skilled person will appreciate that the mentioned uses of beam control elements are mentioned as exemplary applications and not as restrictions on the functionalities that can be accomplished with the present invention.

Referring to FIG. 11 and FIG. 13, as already mentioned, in some embodiments of this invention the inlay (50) may include a passive element (54) referred to as "calibration aperture", which serves as a stopping component for deviating or deflected parts of the particle beam (120). FIG. 13 shows an enlarged detail of a longitudinal section of an example of the calibration aperture. The calibration aperture comprises a body (540) surrounding a calibration bore (541), which is an aperture of small radius (r4) along the axis (c3). The aperture serves to limit the size of the beam (100) traversing the charged particle lens by absorbing the parts (120) of the beam which travel outside of the aperture, and only a portion (110) can pass the aperture. In a preferred embodiment of the invention, one of the preceding inlay elements, for instance a multipole electrode (53*a*), enables varying the transversal location of the beam, with respect to the longitudinal axis, e.g. with a varying a voltage applied to selected electrodes of the multiple electrode forming a electric dipole field. A multipole can also be used for beam alignment. The charged particle lens (10) is advantageously configured so as to create a crossover (cx) at a position located at, or in the vicinity (e.g. 10 mm or less) of the longitudinal location of the calibration aperture (54). Thereafter, the beam diameter is smallest near said aperture.

In many embodiments of this invention, in particular in a particle beam apparatus used as a multi-beam writer tool, e.g. a single-column tool (1) or multicolumn tool (40) (for the latter see below), the charged particle beam is split into a plurality of beamlets, which can selectively pass through the pattern-definition system (4, 43) without (e) or with (f) an additional transversal deflection (FIG. 14), introduced by said pattern-definition system. Such deflection is introduced in order to prevent the beamlets from reaching a target and hence define a discrete writing pattern. The deflected beamlets will reach an area on the body (540) of the "calibration aperture" beside the calibration bore (541), rather than traveling through it, and will thus be absorbed therein; the absorption of the beam (120) would cause generation of an electric charge-up in the element which may be eliminated, i.e. drained off, through the electric connection of the beam aperture, for instance towards a measuring device (714) which allows monitoring the amount of the beam absorbed (FIG. 11).

Lithographic Apparatuses

Figure 14:
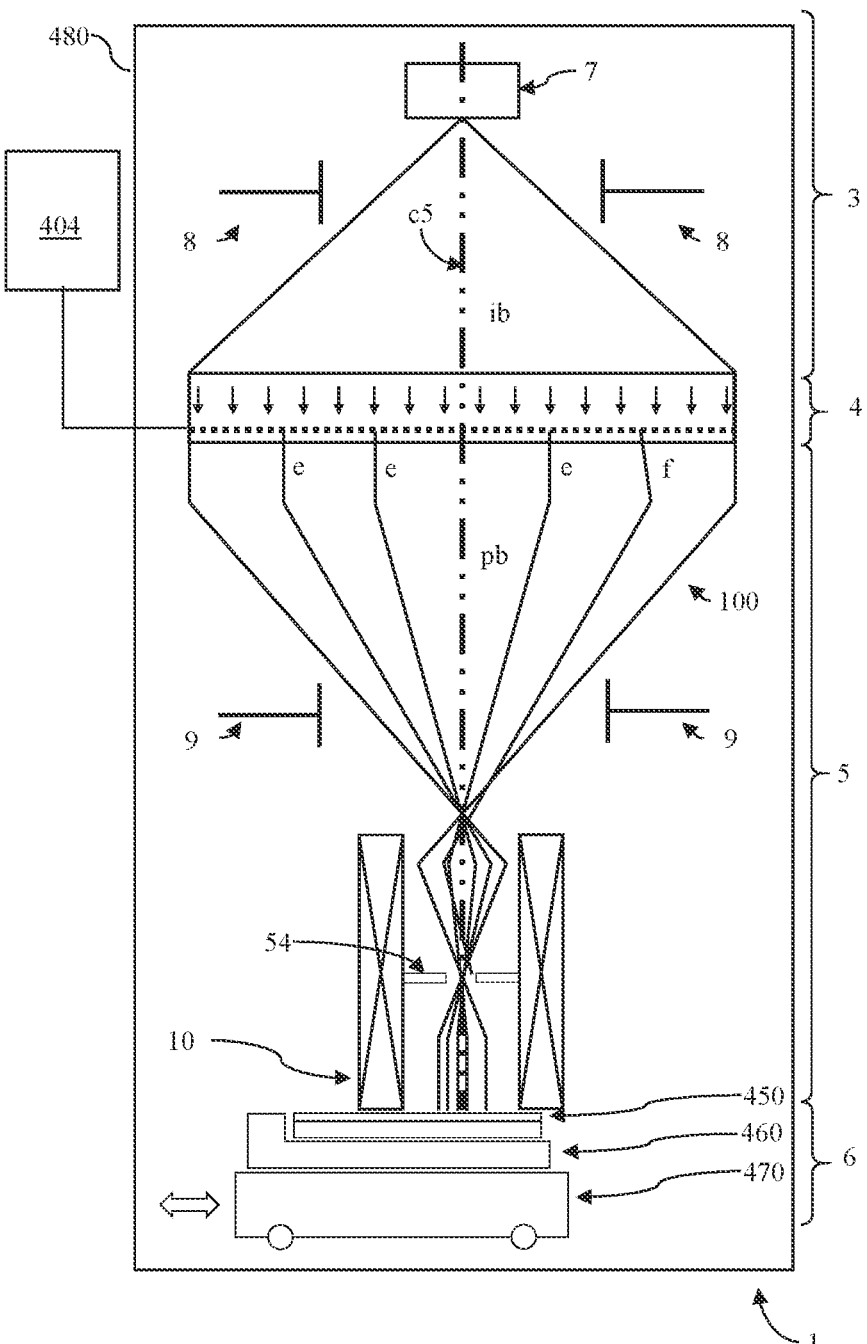
FIG. 14 is a longitudinal sectional view of a slim-column writer tool incorporating a charged particle lens of the invention.

FIG. 14 shows a schematic longitudinal sectional view of a single-column writer tool (1), which includes an exemplary embodiment of a lens of this invention; e.g. incorporating a charged particle lens according to one embodiment of the invention as an objective lens (10) in said tool. The writer tool employs a charged particle beam, which may be of electrons or ions (for instance ions of positive electric charge). A writer tool (1) comprises a vacuum housing (480) for the multi-column charged particle optics, a base (470) onto which the multi-column charged particle optics is mounted. On top of the base an X-Y stage (460), e.g. a laser-interferometer controlled air-bearing vacuum stage onto which a target (450), preferably an mask for lithographic purposes or silicon wafer in direct-writer tools, is mounted using a suitable handling system. The target may then be exposed with said charged particle beam of the writer, which e.g. comprise an resist layer.

The single-column optics of this embodiment preferably comprises a central axis (c5), an illuminating system (3) including a charged particle source (7), a condenser (8) delivering a broad telecentric charged-particle beam (ib) to a pattern definition system (4) being adapted to let pass the beam only through a plurality of apertures defining the shape of sub-beams ("beamlets") permeating said apertures (beam shaping device), and a typically demagnifying and further energizing charged particle projection optics (5), composed of a number of consecutive charged particle lenses, which preferably include electrostatic and/or magnetic lenses, and possibly other particle-optical devices. In the embodiment shown in FIG. 14, the projection optics comprises e.g. a first charged particle lens (9), e.g. an electrostatic immersion lens, whereas a second lens (10), located downstream of the first lens, is realized using an charged particle lens according to an embodiment to this invention (e.g. FIG. 10A). Inside said charged particle lens (10) a "calibration aperture" (54) is realized as symbolically depicted; as described above, a portion of the beam (f), which was deflected by the pattern definition device (4), is absorbed, whilst other portions (e) will traverse the optical column unimpeded and expose a pattern onto the target (450).

A pattern definition device (4) serves to form the particle beam into a plurality of so-called beamlets which contain the information of the pattern to be transferred to the target. The structure, operation and data-handling of the pattern definition device (4) and its control device (404) are disclosed in U.S. Pat. Nos. 9,443,699 and 9,495,499 of the applicant, and the disclosure of those documents are herewith included by reference into the present disclosure.

FIGS. 15A and 15B illustrate a multi-column writer tool (40) which includes, in each column, a respective instance of an exemplary embodiment of a lens of this invention; e.g. incorporating a charged particle lens according to one embodiment of the invention as an objective lens (10) in said tool. The writer tool employs a number of charged particle beams, which may be of electrons or ions (for instance ions of positive electric charge). As can be seen in FIG. 15A, which shows a schematic longitudinal sectional view of the multi-column writer tool (40), the writer tool (40) comprises a vacuum housing (48) for the multi-column charged particle optics, a base (47) onto which the multi-column charged particle optics is mounted. On top of the base an X-Y stage (46), e.g. a laser-interferometer controlled air-bearing vacuum stage onto which a target (45), preferably an mask for lithographic purposes or silicon wafer in direct-writer tools, is mounted using a suitable handling system. The target may then be exposed with said charged particle beam of the writer, which e.g. comprise an resist layer.

The multi-column optics of this embodiment comprises a plurality of subcolumns (400) (the number of columns shown is reduced in the depiction for better clarity, and represent a much larger number of columns that are present in the multicolumn apparatus in a realistic implementation). Preferably, the sub-columns have identical setups and are installed side-by-side with mutually parallel axes (c5). Each sub-column has an illuminating system (42) including a charged particle source (41), delivering a broad telecentric charged-particle beam to a pattern definition system (43) being adapted to let pass the beam only through a plurality of apertures defining the shape of sub-beams ("beamlets") permeating said apertures (beam shaping device), and a typically demagnifying and further energizing charged particle projection optics (44), composed of a number of consecutive charged particle lenses, which preferably include electrostatic and/or magnetic lenses, and possibly other particle-optical devices. In the embodiment of FIG. 15, the projection optics comprises e.g. a first charged particle lens (44a), e.g. an electrostatic immersion lens, whereas a second lens (10), located downstream of the first lens, is realized using an charged particle lens according to an embodiment to this invention (e.g. FIG. 1A).

FIG. 15 shows, in a detail view, the lenses (10) used as second lens and their supporting components. Each second lens (10) of the sub-columns may be preferably mounted on a reference plate (49) which is mounted by suitable fastening means (49b) onto the column base plate (47) or a specific flange (48) of the vacuum chamber. The reference plate (49) is fabricated from a suitable base material having low thermal expansion, such as a ceramic material based on silicon oxide or aluminum oxide, which has the advantage of little weight, high elasticity module and high thermal conductivity, and may suitably be covered with an electrically conductive coating, at least at its relevant parts, in order to avoid charging (by allowing electrostatic charges being drained off). It may also comprise apertures (49a) coinciding with the beam passage (11) of the lenses (10) of each sub-column.

The invention claimed is:

1. A charged particle lens configured to modify a charged-particle beam of a charged particle optical system, the lens being provided with a beam passage extending primarily along a longitudinal axis and allowing the passage of a charged-particle beam, said lens including a magnetic circuit assembly comprising:

at least one permanent magnet;

a yoke body; and at least one shunting device, said yoke body being composed of at least two yoke components, of which a first yoke component realizes an inner yoke shell, arranged surrounding the passage space, and a second yoke component realizes an outer yoke shell which is arranged surrounding the inner yoke shell, said yoke components being arranged circumferentially around the longitudinal axis and comprise a ferromagnetic or ferrimagnetic material;

said at least one permanent magnet being arranged between the at least two yoke components and circumferentially around the inner yoke shell, said at least one permanent magnet comprising a permanent magnetic material being magnetically oriented with its two magnetic poles towards respective yoke components;

wherein in the magnetic circuit assembly, the at least one permanent magnet and the yoke body form a closed magnetic circuit but having at least two gaps formed between respective axial faces of different yoke components, wherein the closed magnetic circuit is configured to direct a magnetic flux density coming from said at least one permanent magnet through the yoke body and, in said gaps, induce a magnetic field, which reaches inwards into the beam passage, and said at least one shunting device comprising at least one magnetically permeable shunting component and being arranged in a defined position between the at least two components of the yoke body, said at least one shunting device enabling a defined portion of the magnetic flux density to bypass at least parts of the magnetic circuit assembly;

wherein the at least one shunting component is composed of two or more sector components made of magnetically permeable materials, said sector components being arranged around the longitudinal axis at respectively different azimuthal positions, wherein at least one of said sector components comprises a magnetically permeable material having a magnetic permeability that is different from the magnetic permeability of the magnetically permeable materials of the other sector components, enabling the charged particle lens to have azimuthal differentially varying magnetic flux densities and thus azimuthally varying magnetic fields around the longitudinal axis.

2. The charged particle lens of claim 1, having an overall rotationally symmetric shape along said longitudinal axis, wherein the components of the magnetic circuit assembly, namely, the at least one permanent magnet;

the yoke body; and the at least one shunting device, are arranged coaxial with said longitudinal axis and preferably have basic shapes corresponding to hollow cylinders or hollow polygonal prismatic shapes.

3. The charged particle lens of claim 1, wherein the at least one shunting component is composed of two or more layers stacked along the longitudinal axis and/or of one or more sectors arranged around the longitudinal axis.

4. The charged particle lens of claim 1, wherein the at least one permanent magnet is composed of at least two sub-components arranged around the longitudinal axis at respectively different azimuthal positions, wherein one or more of the at least one shunting device or of the sector components is placed between respective two of said permanent-magnet sub-components.

5. The charged particle lens of claim 1, wherein the second yoke component realizes a housing body of the charged particle lens, which surrounds other components of the lens including all other yoke components.

6. The charged particle lens of claim 1, wherein the at least one permanent magnet has a magnetization oriented substantially radially, and the at least one shunting device comprises a ferromagnetic or ferrimagnetic material at least along a direction parallel to said substantially radially oriented magnetization.

7. The charged particle lens of claim 1, wherein the at least one permanent magnet is composed of at least two sub-components, namely:

segmented according to two or more layers stacked along a longitudinal axis; and/or split into two or more sectors arranged around a longitudinal axis.

8. The charged particle lens of claim 7, wherein at least one shunting device is placed between respective two of said sub-components.

9. A charged-particle optical apparatus including the charged particle lens of claim 1, and configured for influencing a charged-particle beam of said apparatus propagating through the lens along the longitudinal axis thereof, wherein said lens is part of a particle-optical system of said apparatus.

10. The charged-particle optical apparatus of claim 9, wherein the apparatus is realized as a multi-column system comprising a plurality of particle-optical columns, each column being configured to employ a respective particle beam and comprising a respective particle-optical system which includes a respective instance of a charged particle or electromagnetic lens.

11. An electromagnetic lens including a charged particle lens and a sleeve insert inserted into the passage space along the longitudinal axis, wherein the charged particle lens is configured to modify a charged-particle beam of a charged particle optical system, the lens being provided with a beam passage extending primarily along a longitudinal axis and allowing the passage of a charged-particle beam, said lens including a magnetic circuit assembly comprising:

at least one permanent magnet;

a yoke body; and at least one shunting device, said yoke body being composed of at least two yoke components, of which a first yoke component realizes an inner yoke shell, arranged surrounding the passage space, and a second yoke component realizes an outer yoke shell which is arranged surrounding the inner yoke shell, said yoke components being arranged circumferentially around the longitudinal axis and comprise a ferromagnetic or ferrimagnetic material;

said at least one permanent magnet being arranged between the at least two yoke components and circumferentially around the inner yoke shell, said at least one permanent magnet comprising a permanent magnetic material being magnetically oriented with its two magnetic poles towards respective yoke components;

wherein in the magnetic circuit assembly, the at least one permanent magnet and the yoke body form a closed magnetic circuit but having at least two gaps formed between respective axial faces of different yoke components, wherein the closed magnetic circuit is configured to direct a magnetic flux density coming from said at least one permanent magnet through the yoke body and, in said gaps, induce a magnetic field, which reaches inwards into the beam passage, and said at least one shunting device comprising at least one magnetically permeable shunting component and being arranged in a defined position between the at least two components of the yoke body, said at least one shunting device enabling a defined portion of the magnetic flux density to bypass at least parts of the magnetic circuit assembly;

said sleeve insert surrounding a beam passage having a radius smaller than the radius of the beam passage of the charged-particle lens, the sleeve insert extending along a longitudinal axis, said sleeve insert comprising a mounting body, which is at least partially electrically conductive, and at least one electrically conductive electrode element, said at least one electrode element being configured to be applied an electric potential via a power supply so as to generate an electrostatic field within the beam passage of the charged particle lens;

wherein the at least one electrode element includes a beam aperture element forming a delimiting opening with a defined radius around the longitudinal axis, said delimiting opening being configured to limit the lateral width of a charged-particle beam propagating along the longitudinal axis; and said beam aperture element being connected to a current measurement device configured to measure an amount of the charged-particle beam absorbed at the beam aperture element.

12. The electromagnetic lens of claim 11, wherein the longitudinal axis of said sleeve insert coincides with the longitudinal axis of the charged particle lens.

13. The electromagnetic lens of claim 11, wherein the at least one electrode element is configured to form a particle optical lens in conjunction with the magnetic field within the beam passage of the charged particle lens at the at least two gaps, wherein a focal length of said particle-optical lens is adjustable through modifying the electric potentials applied to the at least one electrode elements.

14. The electromagnetic lens of claim 11, wherein the inner yoke shell extends along the longitudinal axis and surrounds the sleeve insert circumferentially, and the at least two gaps of the closed magnetic circuit are located at either axial end of the inner yoke shell, each gap generating a defined magnetic field, reaching inwards into the beam passage opening, said electrostatic field generated by one or more of the at least one electrode element of the sleeve insert being configured to at least partially overlap with the respective defined fields in each gap.

15. The charged particle lens of claim 11, wherein one or more of the at least one electrode element includes an electrostatic multipole electrode, comprising a number of sub-electrodes arranged uniformly around the longitudinal axis along a circumferential direction, said sub-electrodes being connectable to the power supply, which comprises a multi-channel power supply unit feeding potentials to each sub-electrode individually.

16. A charged-particle optical apparatus including the electromagnetic lens of claim 11, and configured for influencing a charged-particle beam of said apparatus propagating through the electromagnetic lens along the longitudinal axis thereof, wherein said electromagnetic lens is part of a particle-optical system of said apparatus.

17. The charged-particle optical apparatus of claim 16, wherein the apparatus is realized as a multi-column system comprising a plurality of particle-optical columns, each column being configured to employ a respective particle beam and comprising a respective particle-optical system which includes a respective instance of a charged particle or electromagnetic lens.

* * * * *